US010777244B2

(12) United States Patent
Chiu et al.

(10) Patent No.: US 10,777,244 B2
(45) Date of Patent: Sep. 15, 2020

(54) THREE-DIMENSIONAL (3-D) WRITE ASSIST SCHEME FOR MEMORY CELLS

(71) Applicant: TAIWAN SEMICONDUCTOR MANUFACTURING COMPANY, LTD., Hsinchu (TW)

(72) Inventors: Chih-Chieh Chiu, Hsinchu (TW); Chia-En Huang, Xinfeng Township (TW); Fu-An Wu, Hsinchu (TW); I-Han Huang, Tainan (TW); Jung-Ping Yang, Uhi-bei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/205,534

(22) Filed: Nov. 30, 2018

(65) Prior Publication Data

US 2019/0096458 A1 Mar. 28, 2019

Related U.S. Application Data

(63) Continuation of application No. 14/086,153, filed on Nov. 21, 2013, now Pat. No. 10,176,855.

(51) Int. Cl.

| | |
|---|---|
| ***G11C 11/419*** | (2006.01) |
| ***G11C 8/10*** | (2006.01) |
| ***G11C 7/02*** | (2006.01) |
| ***G11C 8/14*** | (2006.01) |
| ***G11C 11/418*** | (2006.01) |

(52) U.S. Cl.

CPC .................. *G11C 8/10* (2013.01); *G11C 7/02* (2013.01); *G11C 8/14* (2013.01); *G11C 11/418* (2013.01); *G11C 11/419* (2013.01)

(58) Field of Classification Search

CPC ..... G11C 11/41; G11C 11/412; G11C 11/413; G11C 11/417; G11C 11/418; G11C 11/419

USPC ............................... 365/154, 189.16, 230.06

See application file for complete search history.

(56) References Cited

U.S. PATENT DOCUMENTS

| | | | | |
|---|---|---|---|---|
| 9,001,611 | B1 | 4/2015 | Wu et al. | |
| 2010/0061176 | A1 | 3/2010 | Kim et al. | |
| 2012/0051151 | A1 | 3/2012 | Wu et al. | |
| 2012/0287733 | A1* | 11/2012 | van Winkelhoff ....... | G11C 7/02 365/189.16 |
| 2015/0103604 | A1* | 4/2015 | Sheikh .................... | G11C 7/12 365/189.05 |

* cited by examiner

*Primary Examiner* — Alfredo Bermudez Lozada

(74) *Attorney, Agent, or Firm* — Hauptman Ham, LLP

(57) ABSTRACT

An integrated circuit includes an array of write assist circuits electrically connected to a memory cell array. Each write assist circuit is configured to set an operating voltage of a corresponding memory cell. Each write assist circuit is configured to receive at least a first control signal, and generate an output signal at least in response to the first control signal. The output signal controlling the operating voltage of the corresponding memory cell. Each write assist circuit includes a programmable voltage tuner. The programmable voltage tuner includes a first P-type transistor and a second P-type transistor coupled to the first P-type transistor. A first terminal of the first P-type transistor is configured as a first input node to receive a first select control signal. A first terminal of the second P-type transistor is configured as a second input node to receive a second select control signal.

20 Claims, 10 Drawing Sheets

THREE-DIMENSIONAL (3-D) WRITE ASSIST SCHEME FOR MEMORY CELLS

PRIORITY CLAIM

The present application is a continuation of U.S. application Ser. No. 14/086,153, filed Nov. 21, 2013, now U.S. Pat. No. 10,176,855, issued Jan. 8, 2019, which is incorporated herein by reference in its entirety.

BACKGROUND

The semiconductor integrated circuit (IC) industry has produced a wide variety of digital devices to address issues in a number of different areas. Some of these digital devices, such as a system on a chip (SoC) device having a microprocessor, are electrically coupled to static random access memory (SRAM) devices for the storage of digital data. As ICs have become smaller and more complex, operating voltages continue to decrease affecting IC performance.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

Figure 1:
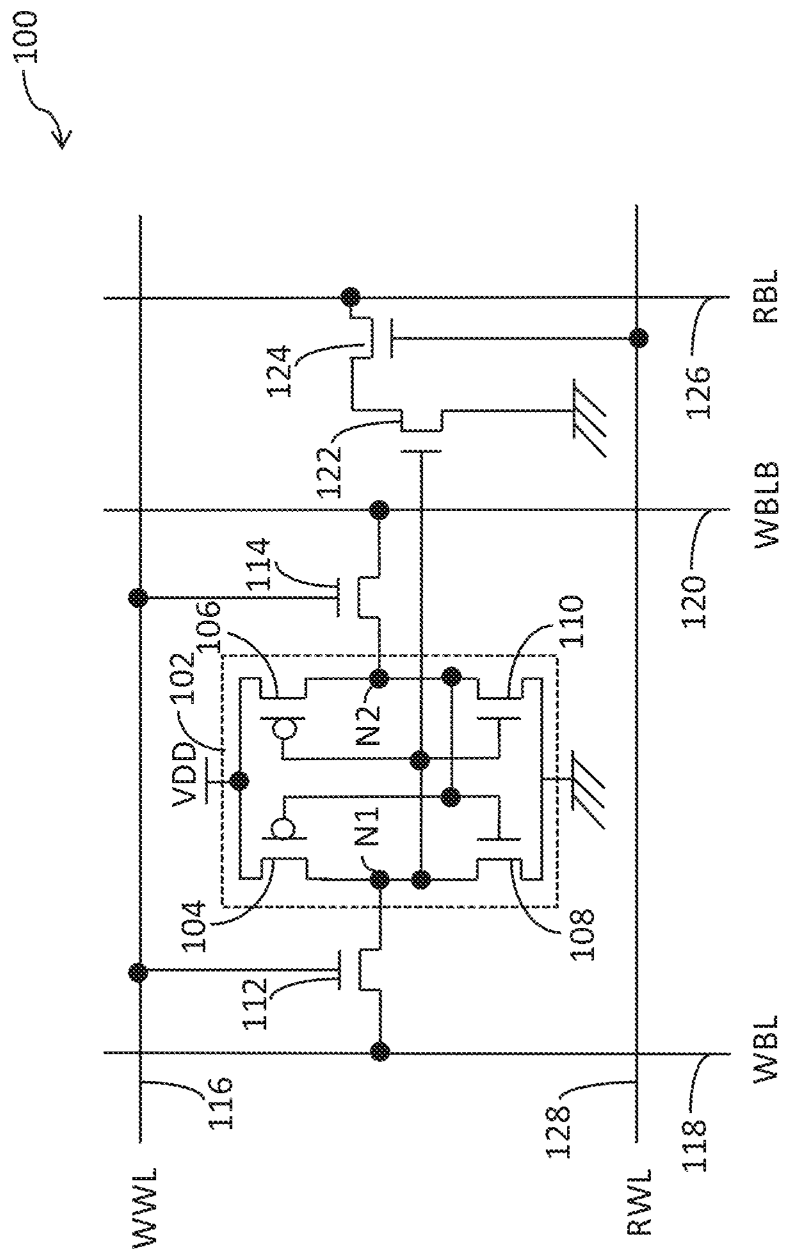
FIG. 1 is a schematic diagram of a memory cell in accordance with one or more embodiments.

The following disclosure provides different embodiments, or examples, for implementing features of the provided subject matter. Specific examples of components and arrangements are described below to simplify the present disclosure. These are, of course, merely examples and are not limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The following disclosure provides many different embodiments, or examples, for implementing different features of the disclosed subject matter. Specific examples of components and arrangements are described below to simplify the present disclosure. These are examples and are not intended to be limiting.

This description of the various embodiments is intended to be read in connection with the accompanying drawings, which are to be considered part of the entire written description. In the description, relative terms such as "before," "after," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the system be constructed or operated in a particular orientation. Terms concerning attachments, coupling and the like, such as "connected" and "interconnected," refer to a relationship wherein components are attached to one another either directly or indirectly through intervening components, unless expressly described otherwise.

FIG. 1 is a schematic diagram of a memory cell 100 in accordance with one or more embodiments. In some embodiments, the memory cell 100 is an eight transistor (8T) static random access memory (SRAM) memory cell. In some embodiments, the memory cell 100 employs a number of transistors other than eight. The memory cell 100 includes a pair of cross-coupled inverters 102. The cross-coupled inverters 102 include two p-type metal oxide semiconductor (PMOS) transistors 104, 106 each having source terminals electrically connected to a power supply voltage (VDD) terminal. The two PMOS transistors 104, 106 each have drain terminals separately electrically connected to drain terminals of two n-type metal oxide semiconductor (NMOS) transistors 108, 110 at corresponding nodes N1 and N2. Source terminals of NMOS transistors 108, 110 are electrically connected to ground voltage (VSS). A gate terminal of PMOS transistor 104 is electrically connected to a gate terminal of NMOS transistor 108 and the drain terminal of NMOS transistor 110. Similarly, a gate terminal of PMOS transistor 106 is electrically connected to a gate terminal of NMOS transistor 110 and the drain terminal of NMOS transistor 108.

The memory cell 100 includes a write access NMOS transistor 112 having a source terminal electrically connected to node N1 and a write access NMOS transistor 114 having a source terminal electrically connected to node N2. Gate terminals of write access NMOS transistors 112, 114 are electrically connected to a write word line (WWL) terminal 116. A drain terminal of write access NMOS transistor 112 is electrically connected to a write bit line (WBL) terminal 118. A drain terminal of write access NMOS transistor 114 is electrically connected to a write bit line bar (WBLB) terminal 120. Note that the term "bar" as used in this context indicates a logically inverted signal, for example, WBLB terminal 120 carries a signal logically inverted from a signal carried by WBL terminal 118.

The memory cell 100 includes a read access NMOS transistor 122 having a source terminal electrically connected to VSS, a gate terminal electrically connected to node N1 and a drain terminal electrically connected to a source terminal of a read access NMOS transistor 124. Read access NMOS transistor 124 has a drain terminal electrically connected to a read bit line (RBL) terminal 126 and a gate terminal electrically connected to a read word line (RWL) terminal 128. Note that the PMOS and NMOS types of the transistors 104, 106, 108, 110, 112, 114, 122, 124 described above are merely exemplary and in some embodiments, other types of transistors are used in the memory cell 100.

The memory cell 100 has separate write terminals 116, 118, 120 and read terminals 126, 128 that are used to form a two port memory cell array having a write port and a read port. In some embodiments, additional write ports and/or read ports are used. In some embodiments, memory cell 100 includes a single write port or read port. In some embodiments, memory cell 100 includes more than one write port or read port.

Figure 2:
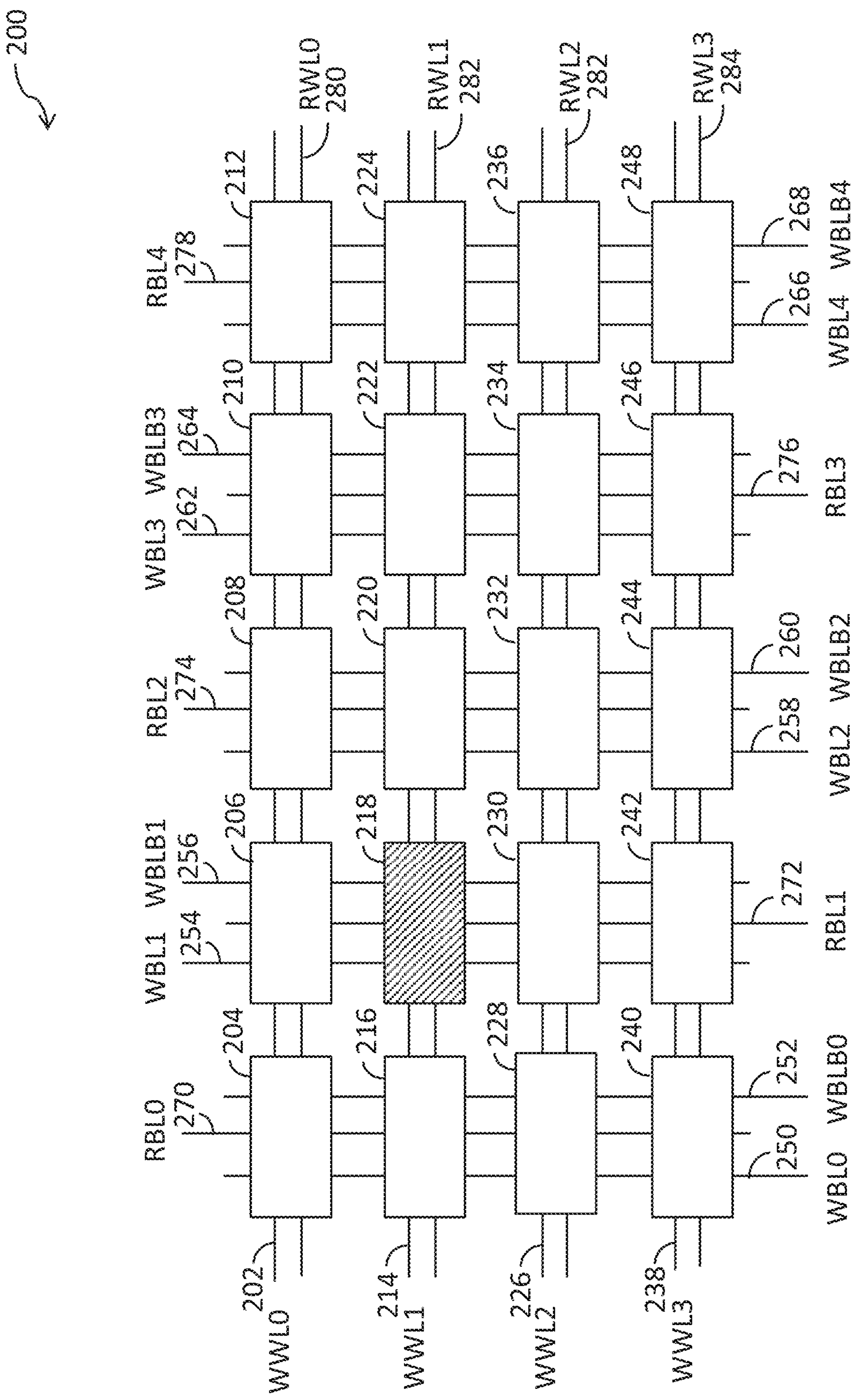
FIG. 2 is a block diagram of a four row by five column representative portion of a memory cell array in accordance with one or more embodiments.

FIG. 2 is a block diagram of a four row by five column representative portion of a memory cell array 200 having two ports in accordance with one or more embodiments. In some embodiments, the memory cell array 200 is part of a three-dimensional, two port register file. A register file is an array of processor registers in a central processing unit (CPU). Integrated circuit-based register files are usually implemented by way of fast SRAMs with multiple ports. In some embodiments, additional write ports and/or read ports are used. In some embodiments, read ports are used. In some embodiments, memory cell array 200 includes a single write port or read port. In some embodiments, memory cell array 200 includes more than one write port or read port. Four write word line (WWL) terminals (WWL0-WWL3) carry signals to activate corresponding rows in the memory cell array 200. WWL0 terminal 202 is electrically connected to WWL terminals of memory cells 204, 206, 208, 210, 212 that form row 0 of the memory cell array 200. WWL1 terminal 214 is electrically connected to WWL terminals of memory cells 216, 218, 220, 222, 224 that form row 1 of the memory cell array 200. WWL2 terminal 226 is electrically connected to WWL terminals of memory cells 228, 230, 232, 234, 236 that form row 2 of the memory cell array 200. WWL3 terminal 238 is electrically connected to WWL terminals of memory cells 240, 242, 244, 246, 248 that form row 3 of the memory cell array 200.

Five write bit line (WBL) terminals (WBL0-WBL4) and five write bit line bar (WBLB) terminals (WBLB0-WBLB4) carry data signals for storage in selected memory cells in a column in the memory cell array 200. WBL0 terminal 250 and WBLB0 terminal 252 are electrically connected to the corresponding WBL and WBLB terminals of memory cells 204, 216, 228, 240 that form column 0 of memory cell array 200. WBL1 terminal 254 and WBLB1 terminal 256 are electrically connected to the corresponding WBL and WBLB terminals of memory cells 206, 218, 230, 242 that form column 1 of memory cell array 200. WBL2 terminal 258 and WBLB2 terminal 260 are electrically connected to the corresponding WBL and WBLB terminals of memory cells 208, 220, 232, 244 that form column 2 of memory cell array 200. WBL3 terminal 262 and WBLB3 terminal 264 are electrically connected to the corresponding WBL and WBLB terminals of memory cells 210, 222, 234, 246 that form column 3 of memory cell array 200. WBL4 terminal 266 and WBLB4 terminal 268 are electrically connected to the corresponding WBL and WBLB terminals of memory cells 212, 224, 236, 248 that form column 4 of memory cell array 200.

Five read bit line (RBL) terminals (RBL0-RBL4) carry data signals in selected cells in a column in the memory cell array 200. RBL0 terminal 270 is electrically connected to the RBL terminals of memory cells 204, 216, 228, 240 that form column 0 of memory cell array 200. RBL1 terminal 272 is electrically connected to the RBL terminals of memory cells 206, 218, 230, 242 that form column 1 of memory cell array 200. RBL2 terminal 274 is electrically connected to the RBL terminals of memory cells 208, 220, 232, 244 that form column 2 of memory cell array 200. RBL3 terminal 276 is electrically connected to the RBL terminals of memory cells 210, 222, 234, 246 that form column 3 of memory cell array 200. RBL4 terminal 278 is electrically connected to the RBL terminals of memory cells 212, 224, 236, 248 that form column 4 of memory cell array 200.

Four read word line (RWL) terminals (RWL0-RWL3) are used to activate a row of memory cells in the memory cell array 200. RWL0 terminal 280 is electrically connected to the RWL terminals of row 0 of memory cell array 200. RWL1 terminal 282 is electrically connected to the RWL terminals of row 1 of memory cell array 200. RWL2 terminal 284 is electrically connected to the RWL terminals of row 2 of memory cell array 200. RWL3 terminal 286 is electrically connected to the RWL terminals of row 3 of memory cell array 200.

By way of an illustrative example, a write operation is performed to row 1 that includes memory cells 216, 218, 220, 222, 224 by activating the WWL1 terminal 214. The WBL1 terminal 254 and WBLB1 terminal 256 are also active for receiving data signals and storing a binary bit of data in column 1 that includes memory cells 206, 218, 230, 242. Together, WWL1 terminal 214, WBL1 terminal 254 and WBLB1 terminal 256 select and store a binary bit of data in memory cell 218. During a write operation, a binary bit of data is stored in memory cell 218 by forcing complimentary voltages, either 0 and 1 or 1 and 0, on WWL1 terminal 214 and WBL1 terminal 254, respectively. Access transistors 112 and 114, as shown in FIG. 1, are turned ON by raising the WWL1 terminal 214 to a high voltage. This enables the binary bit of data to be driven into the cross-coupled pair 102, as shown in FIG. 1. The access transistors 112, 114 are then turned OFF and positive feedback of the cross-coupled pair 102, as shown in FIG. 1, ensures that binary bit of data is maintained in memory cell 218.

In this example, memory cell 218 is selected for receiving and storing the binary bit of data because memory cell 218 is the only memory cell in both row 1 and column 1. However, the remaining cells in row 1, activated by the WWL1 terminal 214, are considered to be unselected cells for data writing purposes, but still have their write access gates activated by the WWL1 terminal. Specifically, the unselected cells in row 1 of the memory cell array 200 are memory cells 216, 220, 220, 224. If the unselected memory cells in row 1 are activated, or unselected memory cells in column 1 are activated, the Static Noise Margin (SNM) of the corresponding memory cells are affected and a miswrite and/or a misread can occur, each of which negatively affect the performance of the memory cell array 200. SNM is defined as the minimum noise voltage present at each of the memory cells necessary to flip the state of the memory cell.

Figure 3:
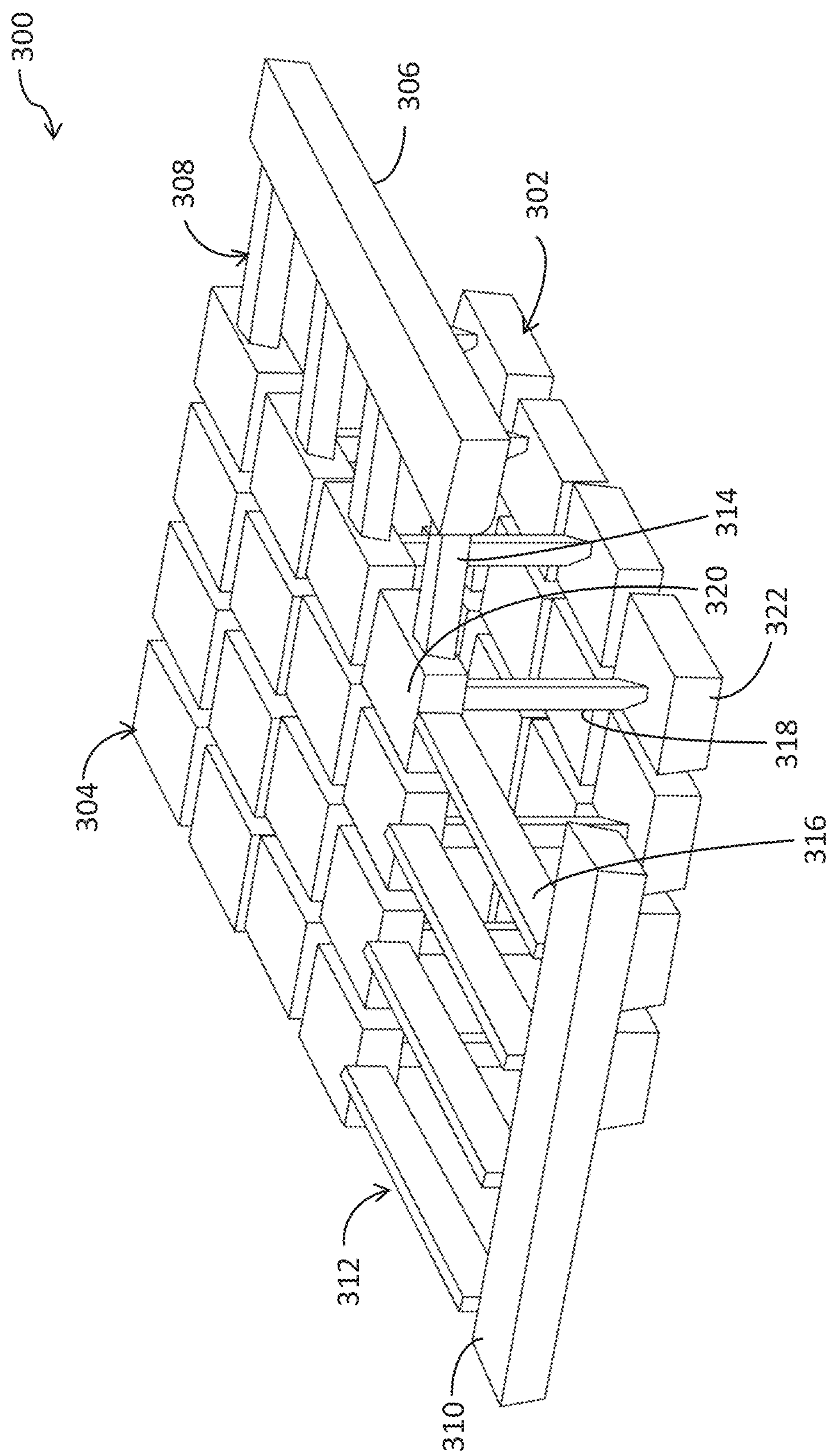
FIG. 3 is a perspective view block diagram of a three-dimensional (3D) memory cell array having a separated write logic cell array in accordance with one or more embodiments.

FIG. 3 is a block diagram of a three-dimensional (3D) memory cell array 300 having a separated write logic cell array 304 in accordance with one or more embodiments. The 3D memory cell array 300 includes a memory cell array 302 and a write logic cell array 304. In some embodiments, the memory cell array 302 is an array of 8T SRAM memory cells. In some embodiments, the memory cell array 302 is an array of 6T SRAM memory cells. In some embodiments, the 3D memory cell array 300 has a greater or less number of transistors than other embodiments. In some embodiments, the memory cell array 302 has two ports, specifically, a read port and a write port. In some embodiments, the memory cell array 302 has more than two ports. In some embodiments, memory cell array 302 includes a single port. In some embodiments, memory cell array 302 includes more than one port.

A memory cell array 302 is connected to a write logic cell array 304. Each memory cell in the memory cell array 302 is electrically connected to a corresponding write logic cell of the write logic cell array 304. Each row of memory cells in the memory cell array 302 has a corresponding row of write logic cells in the write logic cell array 304. Each column of memory cells in the memory cell array 302 has a corresponding column of write logic cells in the write logic cell array 304. In some embodiments, each write logic cell of the write logic cell array 304 is electrically connected by an output to the WWL terminal of each memory cell. In some embodiments, each write logic cell includes one or more PMOS transistors or NMOS transistors. In some embodiments, each write logic cell includes one or more logic gates, such as an AND, NAND, OR and NOR gate. In some embodiments, each write logic cell includes a combination of AND, NAND, OR NOR gates or PMOS/NMOS transistors. The write logic cell array 304 is positioned on a different physical level than the memory cell array 302 in an integrated circuit. As shown in FIG. 3, the write logic cell array 304 is on a level above that of the level of the memory cell array 302. In some embodiments, the write logic cell array 304 is on a level below that of the level of the memory cell array 302. In some embodiments, an occupied area of the write logic cell array 304 is substantially equal to an occupied area of the memory cell array 302. In some embodiments, an occupied area of the write logic cell array 304 is smaller than an occupied area of the memory cell array 302. In some embodiments, an occupied area of the write logic cell array 304 is greater than an occupied area of the memory cell array 302. In some embodiments, an occupied area of each write logic cell is substantially equal to an occupied area of each memory cell. In some embodiments, an occupied area of each write logic cell is smaller than an occupied area of each memory cell. In some embodiments, an occupied area of each write logic cell is greater than an occupied area of each memory cell.

A write address row decoder (XDEC) 306 receives address information corresponding to a selected row in the memory cell array 302 for writing a binary bit of data. The XDEC 306 has a separate XDEC write row output 308 for each row of the write logic cell array 304. Each of the XDEC write row outputs 308 are electrically connected to one input terminal of each write logic cell in each row in the write logic cell array 304. A write address column decoder (YDEC) 310 receives address information corresponding to a selected column in the memory cell array 302 for writing a binary bit of data. The YDEC 310 has a separate YDEC write column output 312 for each column of the write logic cell array 304. Each of the YDEC write column outputs 312 is electrically connected to another input terminal of each write logic cell in each column in the write logic cell array 304.

Each write logic cell contained in the write logic cell array 304, combine at least write row output signals received from the XDEC 306 and write column output signal received from the YDEC 310 to generate an output control signal transmitted to the WWL terminal in one selected memory cell in the memory cell array 302. In some embodiments, the output signal controls the one selected memory cell in the memory cell array 302. In some embodiments, each write logic cell contained in the write logic cell array 304 is configured to generate an output control signal used to set the operating voltage of each selected memory cell. In some embodiments, when an individual memory cell is selected and activated, the output control signal has a voltage value sufficiently equal to the voltage supply VDD of the memory cell 322. For example, XDEC write row output 314 and YDEC write column output 316 are logically connected together in the write logic cell array 304 by write logic cell 320 to generate an output control signal transmitted to WWL 318 to activate memory cell 322 for writing a binary bit of data. In some embodiments, the output control signal is used to set an operating voltage of each selected memory cell. The write logic cell array 304 uses signals at least from the XDEC 306 and the YDEC 310 to select and activate a single memory cell for writing a binary bit of data. In this manner, the write logic cell array 304 in the 3D memory cell array 300 selects and activates only one memory cell in a row in a write operation instead of activating each WWL terminal for the entire row of selected and unselected memory cells. Because only one memory cell is activated by the WWL signal in the 3D memory cell array 300, instead of an entire row of memory cells, the performance of the memory cell array 200 is enhanced and miswrites from SNM are reduced. In some embodiments, write logic cell array 304 uses signals from at least the XDEC 306, the YDEC 310 and a control signal WAP to select and activate a single memory cell for writing a binary bit of data.

Figure 4A:
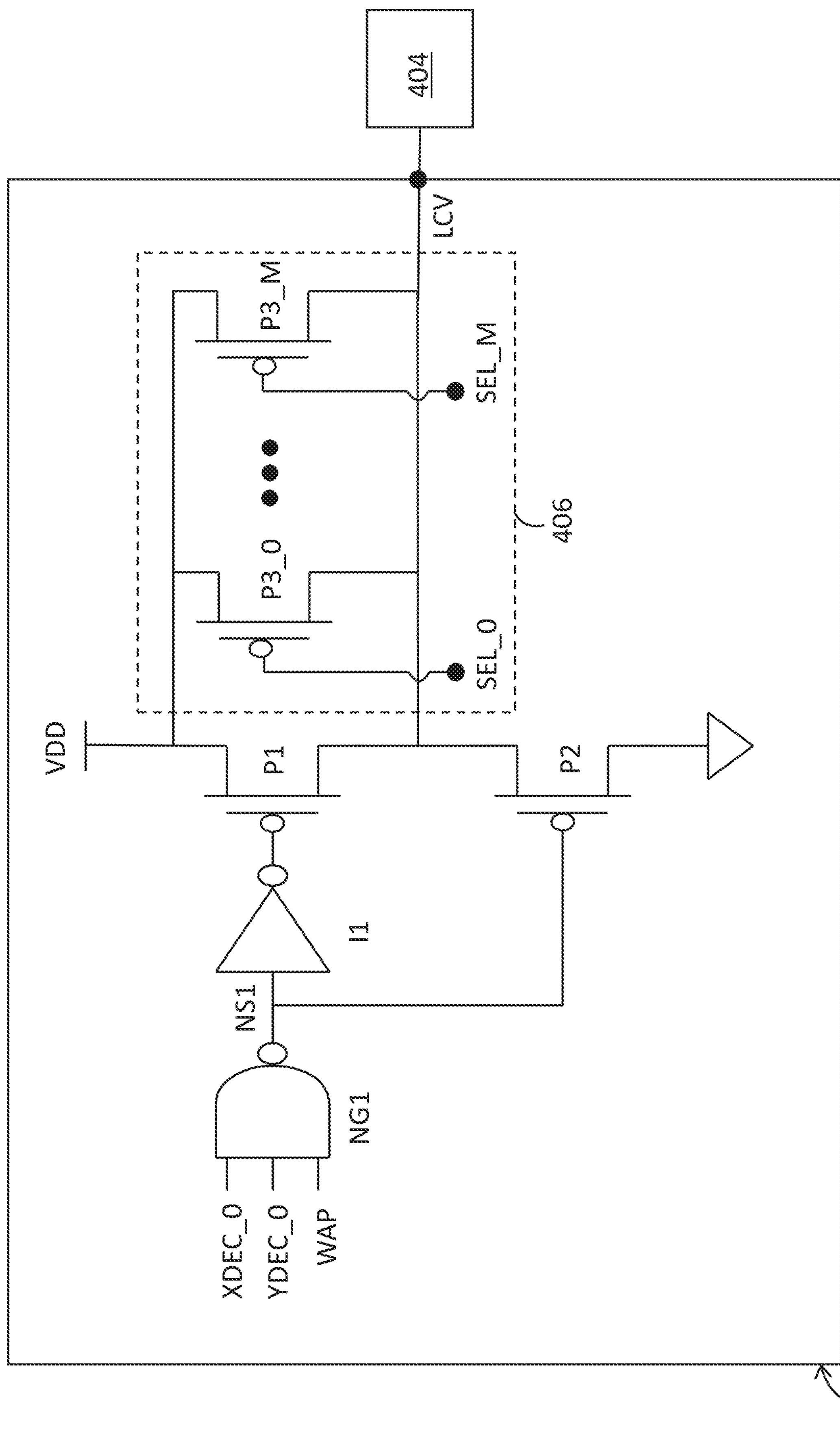
FIG. 4A is a schematic diagram of a write logic cell in accordance with one or more embodiments.

FIG. 4A is a schematic diagram of a write logic cell 402 in accordance with one or more embodiments. Write logic cell 402 is an embodiment of write logic cell 320 shown in FIG. 3 and memory cell 404 is an embodiment of memory cell 322 in FIG. 3. Write logic cell 402 is connected to memory cell 404. Write logic cell 402 is configured to receive an X-Decoder signal XDEC_0, a Y-Decoder signal YDEC_0, and an input control signal WAP. Write logic cell 402 is configured to send output control signal LCV to memory cell 404. Write logic cell 402 includes a NAND gate NG1, an inverter I1, a p-type Metal-Oxide Semiconductor Field Effect (PMOS) transistor P1, a PMOS transistor P2, and a programmable voltage tuner 406. Programmable voltage tuner 406 includes PMOS transistors P3_0, . . . , P3_M (where M is an integer with a value ranging from 0 to 5).

NAND gate NG1 is configured to receive X-Decoder signal XDEC_0, Y-Decoder signal YDEC_0, and input control signal WAP. The X-Decoder signal XDEC_0 is e.g., a low logical value or a high logical value. The X-Decoder signal XDEC_0 is an embodiment of the XDEC write row output 308 shown in FIG. 3. The Y-Decoder signal YDEC_0 is e.g., a low logical value or a high logical value. The Y-Decoder signal YDEC_0 is an embodiment of the YDEC write column output 312 shown in FIG. 3. The input control signal WAP is e.g., a low logical value or a high logical value. In some embodiments, input control signal WAP is received from a WAP generator positioned on the same level as the write logic cell 402. In some embodiments, input control signal WAP controls the pulse width of output signal LCV. In some embodiments, each write logic cell 402 includes a corresponding input control signal WAP. NAND gate NG1 is configured to send a signal NS1. NAND gate NG1 is connected to inverter I1 and PMOS transistor P2. NAND gate NG1 includes three inputs; one input of NAND gate NG1 is connected to the source of the X-Decoder signal XDEC_0, one input of NAND gate NG1 is connected to the source of the Y-Decoder signal YDEC_0 and one input of NAND gate NG1 is connected to the source of the input control signal WAP.

Inverter I1 is connected to NAND gate NG1, PMOS transistor P1 and PMOS transistor P2. Inverter I1 is configured to invert signal NS1 received from the NAND gate NG1 resulting in a signal that selectively turns on/off PMOS transistor P1.

The gate of PMOS transistor P1 is connected to Inverter I1 and is configured to receive the inverted NAND gate signal. The source of PMOS transistor P1 is connected to a voltage source VDD and to the source of PMOS transistors P3_0, . . . , P3_M (where M is an integer with a value ranging from 0 to 5). The drain of PMOS transistor P1 is connected to the source of PMOS transistor P2, the drain of PMOS transistors P3_0, . . . , P3_M, and memory cell 404. In some embodiments, PMOS transistor P1 functions as a switch triggered by the received inverted NAND gate signal. For example, if the received inverted signal is a low logical value, the PMOS transistor P1 is in an ON state. For example, if the received inverted signal is a high logical value, the PMOS transistor P1 is in an OFF state. In some embodiments, transistor P1 is an NMOS transistor or another equivalent circuit that functions as a switch device.

The gate of PMOS transistor P2 is connected to NAND gate NG1 and Inverter I1, and is configured to receive the signal NS1 from NAND gate NG1. The drain of PMOS transistor P2 is connected to ground. The source of PMOS transistor P2 is connected to the drain of PMOS transistor P1, the drain of PMOS transistors P3_0, . . . , P3_M (where M is an integer with a value ranging from 0 to 5), and memory cell 404. In some embodiments, PMOS transistor P2 functions as a switch triggered by the received signal NS1. For example, if the received signal NS1 is a low logical value, the PMOS transistor P2 is in an ON state. For example, if the received signal NS1 is a high logical value, the PMOS transistor P2 is in an OFF state. In some embodiments, transistor P2 is an NMOS transistor or another equivalent circuit that functions as a switch device.

Programmable voltage tuner 406 includes PMOS transistors P3_0, . . . , P3_M (where M is an integer with a value ranging from 0 to 5). In some embodiments, each PMOS transistor P3_0, . . . , P3_M is connected in parallel with each other. Each of the PMOS transistors P3_0, . . . , P3_M is configured to receive corresponding select input signals SEL_0, . . . , SEL_M. Select input signals SEL_0, . . . , SEL_M are a low logical value or a high logical value signal. In some embodiments, M is equal to 0 such that the programmable voltage tuner 406 includes one PMOS transistor (PMOS P3_0) configured to receive select input signal SEL_0. In some embodiments, M is equal to 5 such that the programmable voltage tuner 406 includes six PMOS transistors (PMOS P3_0, PMOS P3_1, PMOS P3_2, PMOS P3_3, PMOS P3_4 and PMOS P3_5) configured to receive select input signals SEL_0, SEL_1, SEL_2, SEL_3, SEL_4 and SEL_5.

The gate of each PMOS transistor P3_0, . . . , P3_M (where M is an integer with a value ranging from 0 to 5) is connected to one or more external sources, and is configured to receive corresponding select input signals SEL_0, . . . , SEL_M (where M is an integer with a value ranging from 0 to 5). The source of each transistor P3_0, . . . , P3_M is connected to voltage source VDD and the source of PMOS transistor P1. The drain of each PMOS transistor P3_0, . . . , P3_M is connected to the drain of PMOS transistor P1, the source of PMOS transistor P2, and memory cell 404. In some embodiments, each of PMOS transistors P3_0, . . . , P3_M function as a switch triggered by the corresponding received select input signals SEL_0, . . . , SEL_M. For example, if the received select signals SEL_0, . . . , SEL_M are a low logical value, the PMOS transistors P3_0, . . . , P3_M are active or in an ON state. For example, if the received select signals SEL_0, . . . , SEL_M are a high logical value, the PMOS transistors P3_0, . . . , P3_M are inactive or in an OFF state. In some embodiments, each of the transistors P3_0, . . . , P3_M are NMOS transistors or another equivalent circuit that functions as a switch device. In some embodiments, some of the PMOS transistors P3_0, . . . , P3_M are active or in an ON state, and the remaining PMOS transistors P3_0, . . . , P3_M are inactive or in an OFF state. In some embodiments, some of the received select signals SEL_0, . . . , SEL_M are a high logical value, and the remaining received select signals SEL_0, . . . , SEL_M are a low logical value. In some embodiments, the number of active PMOS transistors P3_0, . . . , P3_M ranges from 0 to M. In some embodiments, write logic cell 402 includes a total number of PMOS transistors P1, P2 and P3_0, . . . , P3_M which ranges from 3 PMOS transistors to 8 PMOS transistors. Write logic cell 402 operates as a divider circuit; as the number of active PMOS transistors P3_0, . . . , P3_M in unit programmable voltage tuner 406 is increased, the value of output signal LCV is increased.

In some embodiments, integer M is equal to 0 and programmable voltage tuner 406 includes a single stage, PMOS transistor P3_0; if X-Decoder signal XDEC_0, Y-Decoder signal YDEC_0 and input control signal WAP are a high logical value, then output signal NS1 is a low logical value. In this example, if output signal NS1 is a low logical value, PMOS transistor P2 is active and PMOS transistor P1 is inactive. In this example, PMOS transistors P2 and P3_0 function in a PP-type divider; if received select signal SEL_0 is a high logical value, PMOS transistor P3_0 is inactive, and output signal LCV transitions to a low voltage value (shown in FIG. 4C as curve 418); if received select signal SEL_0 is a low logical value, PMOS transistors P3_0 and P2 are active and operate in series as a voltage divider, and output signal LCV transitions to a voltage value located between a low and high value (shown in FIG. 4C as curve 416). As the number of active PMOS transistors P3_0, . . . , P3_M in programmable voltage tuner 406 is increased, the total resistance of the active PMOS transistors P3_0, . . . , P3_M is reduced, and the value of output signal LCV is increased (shown in FIG. 4C as curve 416) and approaches the high voltage value. In some embodiments, output signal LCV transitions to any voltage values located between a low and high value. In some embodiments, PMOS transistors P1 and P2 operate in a complementary manner since one PMOS transistor is active and one PMOS transistor is inactive.

In some embodiments, integer M is equal to 0 and programmable voltage tuner 406 includes a single stage, PMOS transistor P3_0; if at least one of X-Decoder signal XDEC_0, Y-Decoder signal YDEC_0 and input control signal WAP are a low logical value, then output signal NS1 is a high logical value. In this example, if output signal NS1 is a high logical value, PMOS transistor P2 is inactive and PMOS transistor P1 is active. In this example, if received select signal SEL_0 is a high logical value, PMOS transistor P3_0 is inactive, PMOS transistor P1 is active and the value of output signal LCV is increased from a low voltage value to a voltage value located between a low and high value. In this example, if received select signal SEL_0 is a low logical value, PMOS transistors P3_0 and P1 are active and operate in parallel, the total resistance of P1 and the active PMOS transistors P3_0, . . . , P3_M is reduced, and the value of output signal LCV is increased (shown in FIG. 4C as curve 416) and approaches the high voltage value VDD. In some embodiments, output signal LCV transitions to any voltage values located between a low and high value. In some embodiments, PMOS transistors P1 and P2 operate in a complementary manner since one PMOS transistor is active and one PMOS transistor is inactive.

Figure 4B:
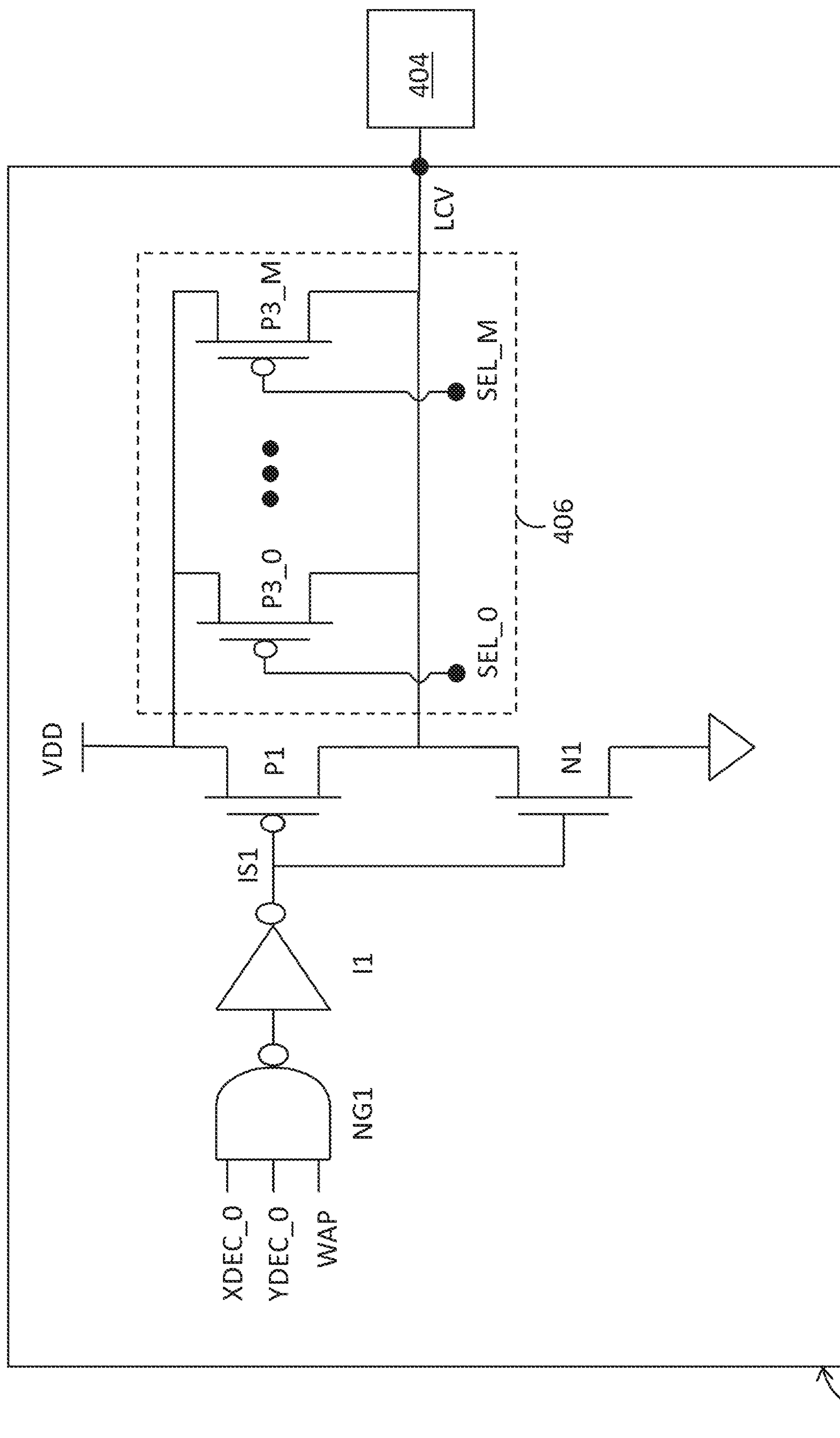
FIG. 4B is a schematic diagram of a write logic cell in accordance with one or more embodiments.

FIG. 4B is a schematic diagram of a write logic cell 408 in accordance with one or more embodiments. Write logic cell 408 is an embodiment of write logic cell 320 shown in FIG. 3 and memory cell 404 is an embodiment of memory cell 322 in FIG. 3. Write logic cell 408 is connected to memory cell 404. Write logic cell 408 is configured to receive an X-Decoder signal XDEC_0, a Y-Decoder signal YDEC_0, and a input control signal WAP. Write logic cell 408 is configured to send output signal LCV to memory cell 404. Write logic cell 408 includes a NAND gate NG1, an inverter I1, a PMOS transistor P1, an NMOS transistor N1 and a programmable voltage tuner 406. Programmable voltage tuner 406 includes PMOS transistors P3_0, . . . , P3_M (where M is an integer with a value ranging from 0 to 5).

NAND gate NG1 is configured to receive X-Decoder signal XDEC_0, Y-Decoder signal YDEC_0, and input control signal WAP. The X-Decoder signal XDEC_0 is e.g., a low logical value or a high logical value. The X-Decoder signal XDEC_0 is an embodiment of the XDEC write row output 308 shown in FIG. 3. The Y-Decoder signal YDEC_0 is e.g., a low logical value or a high logical value. The Y-Decoder signal YDEC_0 is an embodiment of the YDEC write column output 312 shown in FIG. 3. The input control signal WAP is e.g., a low logical value or a high logical value. In some embodiments, the input control signal WAP is received from a WAP generator positioned on the same level as the write logic cell 408. In some embodiments, input control signal WAP controls the pulse width of output signal LCV. In some embodiments, each write logic cell 408 includes a corresponding input control signal WAP. NAND gate NG1 is connected to inverter I1. NAND gate NG1 is configured to send a signal to inverter I1. NAND gate NG1 includes three inputs; one input of NAND gate NG1 is connected to the source of the X-Decoder signal XDEC_0, one input of NAND gate NG1 is connected to the source of the Y-Decoder signal YDEC_0 and one input of NAND gate NG1 is connected to the source of the input control signal WAP.

Inverter I1 is connected to NAND gate NG1, PMOS transistor P1 and NMOS transistor N1. Inverter I1 is configured to receive the signal from the NAND gate NG1. Inverter I1 is configured to send inverted signal IS1 to PMOS transistor P1 and NMOS transistor N1. Inverted signal IS1 selectively turns on/off PMOS transistor P1 and NMOS transistor N1.

The gate of PMOS transistor P1 is connected to Inverter I1 and the gate of NMOS transistor N1. The gate of PMOS transistor P1 is configured to receive inverted signal IS1. The source of PMOS transistor P1 is connected to a voltage source VDD and to the source of PMOS transistors P3_0, . . . , P3_M (where M is an integer with a value ranging from 0 to 5). The drain of PMOS transistor P1 is connected to the drain of NMOS transistor N1, the drain of PMOS transistors P3_0, . . . , P3_M, and memory cell 404.

In some embodiments, PMOS transistor P1 functions as a switch triggered by the received inverted signal IS1. For example, if the received inverted signal IS1 is a low logical value, the PMOS transistor P1 is in an ON state. For example, if the received inverted signal IS1 is a high logical value, the PMOS transistor P1 is in an OFF state. In some embodiments, transistor P1 is an NMOS transistor or another equivalent circuit that functions as a switch device.

The gate of NMOS transistor N1 is connected to Inverter I1 and the gate of PMOS transistor P1. The gate of NMOS transistor N1 is configured to receive inverted signal IS1. The source of NMOS transistor N1 is connected to ground. The drain of NMOS transistor N1 is connected to the drain of PMOS transistor P1, the drain of PMOS transistors P3_0, . . . , P3_M (where M is an integer with a value ranging from 0 to 5), and memory cell 404. In some embodiments, NMOS transistor N1 functions as a switch triggered by the received inverted signal IS1. For example, if the received inverted signal IS1 is a low logical value, the NMOS transistor N1 is in an OFF state. For example, if the received inverted signal IS1 is a high logical value, the NMOS transistor N1 is in an ON state. In some embodiments, transistor N1 is a PMOS transistor or another equivalent circuit that functions as a switch device.

Programmable voltage tuner 406 includes PMOS transistors P3_0, . . . , P3_M (where M is an integer with a value ranging from 0 to 5). In some embodiments, each PMOS transistor P3_0, . . . , P3_M is connected in parallel with each other. Each of the PMOS transistors P3_0, . . . , P3_M is configured to receive corresponding select input signals SEL_0, . . . , SEL_M. Select input signals SEL_0, . . . , SEL_M are a low logical value or a high logical value signal. In some embodiments, M is equal to 0 such that the programmable voltage tuner 406 includes one PMOS transistor (PMOS P3_0) configured to receive select input signal SEL_0. In some embodiments, M is equal to 5 such that the programmable voltage tuner 406 includes six PMOS transistors (PMOS P3_0, PMOS P3_1, PMOS P3_2, PMOS P3_3, PMOS P3_4 and PMOS P3_5) configured to receive select input signals SEL_0, SEL_1, SEL_2, SEL_3, SEL_4 and SEL_5.

The gate of each PMOS transistor P3_0, . . . , P3_M (where M is an integer with a value ranging from 0 to 5) is connected to one or more external sources, and is configured to receive corresponding select input signals SEL_0, . . . , SEL_M (where M is an integer with a value ranging from 0 to 5). The source of each transistor P3_0, . . . , P3_M is connected to voltage source VDD and the source of PMOS transistor P1. The drain of each PMOS transistor P3_0, . . . , P3_M is connected to the drain of PMOS transistor P1, the drain of NMOS transistor N1, and memory cell 404. In some embodiments, each of PMOS transistors P3_0, . . . , P3_M function as a switch triggered by the corresponding received select input signals SEL_0, . . . , SEL_M. For example, if the received select signals SEL_0, . . . , SEL_M are a low logical value, the PMOS transistors P3_0, . . . , P3_M are active or in an ON state. For example, if the received select signals SEL_0, . . . , SEL_M are a high logical value, the PMOS transistors P3_0, . . . , P3_M are inactive or in an OFF state. In some embodiments, each of the transistors P3_0, . . . , P3_M are NMOS transistors or another equivalent circuit that functions as a switch device. In some embodiments, some of the PMOS transistors P3_0, . . . , P3_M are active or in an ON state, and the remaining PMOS transistors P3_0, . . . , P3_M are inactive or in an OFF state. In some embodiments, some of the received select signals SEL_0, . . . , SEL_M are a high logical value, and the remaining received select signals SEL_0, . . . , SEL_M are a low logical value. In some embodiments, the number of active PMOS transistors P3_0, . . . , P3_M ranges from 0 to M. In some embodiments, write logic cell 408 includes a total number of PMOS transistors P1 and P3_0, P3_M which ranges from 2 PMOS transistors to 7 PMOS transistors. Write logic cell 408 operates as a divider circuit; as the number of active PMOS transistors P3_0, . . . , P3_M programmable voltage tuner 406 is increased, the value of output signal LCV is further increased.

In some embodiments, integer M is equal to 0 and programmable voltage tuner 406 includes a single stage, PMOS transistor P3_0; if X-Decoder signal XDEC_0, Y-Decoder signal YDEC_0 and input control signal WAP are a high logical value, then inverted signal IS1 is a high logical value. In this example, if inverted signal IS1 is a high logical value, NMOS transistor N1 is active and PMOS transistor P1 is inactive. In this example, NMOS transistor N1 and PMOS transistors P1 and P3_0 function in a PN-type divider; if received select signal SEL_0 is a high logical value, PMOS transistor P3_0 is inactive and NMOS transistor N1 is active, and output signal LCV transitions to a low voltage value (shown in FIG. 4C as curve 418); if received select signal SEL_0 is a low logical value, PMOS transistor P3_0 and NMOS transistor N1 are active and operate in series as a voltage divider, and output signal LCV transitions to a voltage value located between a low and high value (shown in FIG. 4C as curve 416). As the number of active PMOS transistors P3_0, . . . , P3_M in programmable voltage tuner 406 is increased, the total resistance of the active PMOS transistors P3_0, . . . , P3_M is reduced, and the value of output signal LCV is increased (shown in FIG. 4C as curve 416) and approaches the high voltage value. In some embodiments, output signal LCV transitions to any voltage values located between a low and high value. In some embodiments, PMOS transistor P1 and NMOS transistor N1 operate in a complementary manner since one transistor is active and one transistor is inactive.

In some embodiments, integer M is equal to 0 and programmable voltage tuner 406 includes a single stage, PMOS transistor P3_0; if at least one of X-Decoder signal XDEC_0, Y-Decoder signal YDEC_0 and input control signal WAP are a low logical value, then inverted signal IS1 is a low logical value. In this example, if inverted signal IS1 is a low logical value, NMOS transistor N1 is inactive and PMOS transistor P1 is active. In this example, if received select signal SEL_0 is a high logical value, PMOS transistor P3_0 is inactive, PMOS transistor P1 is active and the value of output signal LCV is increased from a low voltage value to a voltage value located between a low and high value. In this example, if received select signal SEL_0 is a low logical value, PMOS transistors P3_0 and P1 are active and operate in parallel, the total resistance of P1 and the active PMOS transistors P3_0, . . . , P3_M is reduced, and the value of output signal LCV is increased (shown in FIG. 4C as curve 416) and approaches the high voltage value VDD. In some embodiments, output signal LCV transitions to any voltage values located between a low and high value. In some embodiments, PMOS transistors P1 and P2 operate in a complementary manner since one PMOS transistor is active and one PMOS transistor is inactive.

Figure 4C:
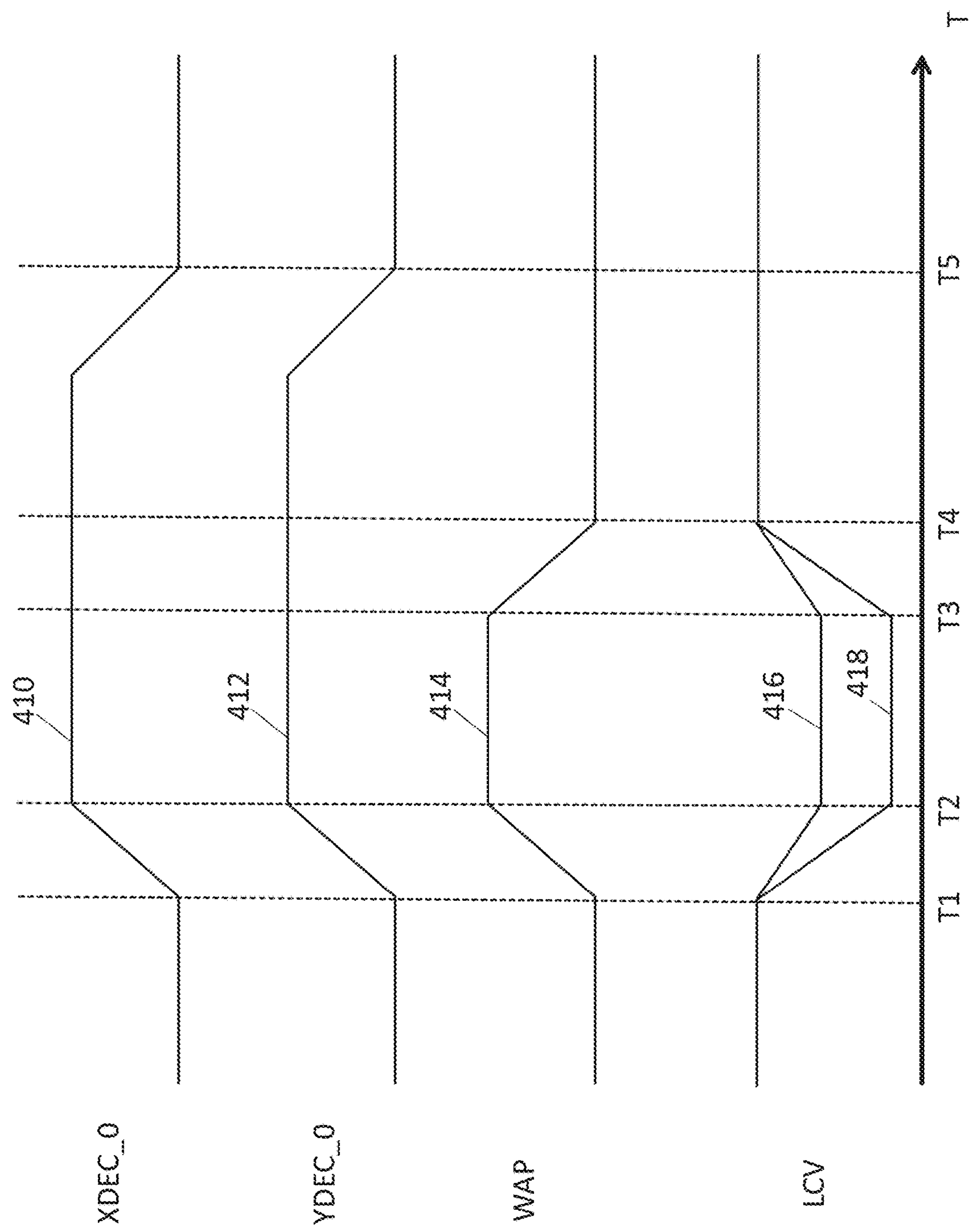
FIG. 4C is a graph of waveforms used to illustrate an operation of the circuits in FIGS. 4A and 4B, in accordance with one or more embodiments.

FIG. 4C is a chart of timing signals for accessing memory cells in accordance with an embodiment of write logic cell 402 or write logic cell 408. The timing chart depicts curves of X-Decoder signal XDEC_0, Y-Decoder signal YDEC_0, input control signal WAP and output signal LCV. As shown in FIG. 4C, the embodiment of write logic cell 402 and write logic cell 408 are functionally equivalent and both produce the output signal LCV.

As depicted in FIG. 4C, X-Decoder signal XDEC_0 starts transitioning from a low voltage signal to a high voltage signal at time T1, finishes transitioning from low to high at time T2 and returns to low at time T5, as represented by curve 410. Y-Decoder signal YDEC_0 starts transitioning from a low voltage signal to a high voltage signal at time T1, finishes transitioning from low to high at time T2 and returns to low at time T5, as represented by curve 412. Input control signal WAP starts transitioning from a low voltage signal to a high voltage signal at time T1, finishes transitioning from low to high at time T2, starts transitioning from a high voltage signal to a low voltage signal at time T3, and returns to low at time T4, as represented by curve 414. The write logic cell 402 receives the X-Decoder signal XDEC_0, Y-Decoder signal YDEC_0 and the input control signal WAP, and the output signal LCV, as represented by curve 416, is generated. In some embodiments, the write logic cell 402 receives the X-Decoder signal XDEC_0, Y-Decoder signal YDEC_0 and the input control signal WAP, and the output signal LCV, as represented by curve 418, is generated. The output signal LCV, as represented by curve 416, is generated according to one or more embodiments of write logic cell 402 if one PMOS transistor P3_0 is active. The output signal LCV, as represented by curve 418, is generated according to one or more embodiments of write logic cell 402 if more than one PMOS transistor P3_0, . . . , P3_M is active. As shown in FIG. 4C, as the number of active PMOS transistors P3_0, . . . , P3_M is increased, the output signal LCV, as represented by curve 416, is increased to a higher, corresponding voltage level.

At time T1, the X-Decoder signal XDEC_0, Y-Decoder signal YDEC_0 and the input control signal WAP start transitioning from a low signal to a high signal. As the X-Decoder signal XDEC_0, Y-Decoder signal YDEC_0 and the input control signal WAP start transitioning from low to high at time T1, the output signal LCV, as represented by curves 416 and 418, starts to discharge toward a low voltage level (from a higher level approximately equal to voltage source VDD).

At time T2, the X-Decoder signal XDEC_0, Y-Decoder signal YDEC_0 and the input control signal WAP finish transitioning from a low signal to a high signal. As the X-Decoder signal XDEC_0, Y-Decoder signal YDEC_0 and the input control signal WAP finish transitioning from low to high at time T2, the output signal LCV, as represented by curves 416 and 418, stops discharging and reaches a relatively flat lower voltage level.

At time T3, the X-Decoder signal XDEC_0 and the Y-Decoder signal YDEC_0 maintain a relatively flat high level, and the input control signal WAP starts transitioning from a high signal to a low signal. As the input control signal WAP starts transitioning from high to low after time T3, the output signal LCV, as represented by curves 416 and 418, starts transitioning from a low voltage level to a high voltage level (approximately equal to VDD).

At time T4, the X-Decoder signal XDEC_0 and the Y-Decoder signal YDEC_0 maintain a relatively flat high level, and the input control signal WAP finishes transitioning from a high signal to a low signal. As the input control signal WAP finishes transitioning from high to low after time T4, the output signal LCV, as represented by curves 416 and 418, finishes transitioning from a low voltage level to a high voltage level (approximately equal to VDD). After time T4, the X-Decoder signal XDEC_0 and the Y-Decoder signal YDEC_0 begin transitioning from a high to a low signal, input control signal WAP maintains a relatively flat low level and the output signal LCV, as represented by curves 416 and 418, maintains a relatively flat high level (approximately equal to VDD).

At time T5, the X-Decoder signal XDEC_0 and the Y-Decoder signal YDEC_0 finish transitioning from a high to a low signal. After time T5, X-Decoder signal XDEC_0, Y-Decoder signal YDEC_0 and input control signal WAP maintain a relatively flat low level, and the output signal LCV, as represented by curves 416 and 418, maintains a relatively flat high level (approximately equal to VDD).

In one or more embodiments, as previously described in FIGS. 4A and 4B, the output signal LCV, as represented by curves 416 and 418, is changed based upon the number of active PMOS transistors P3_0, . . . , P3_M. For example, as the number of active PMOS transistors P3_0, . . . , P3_M is increased, the value of output signal LCV (as represented by curve 418) is increased to a higher corresponding voltage level (as represented by curve 416).

Figure 5A:
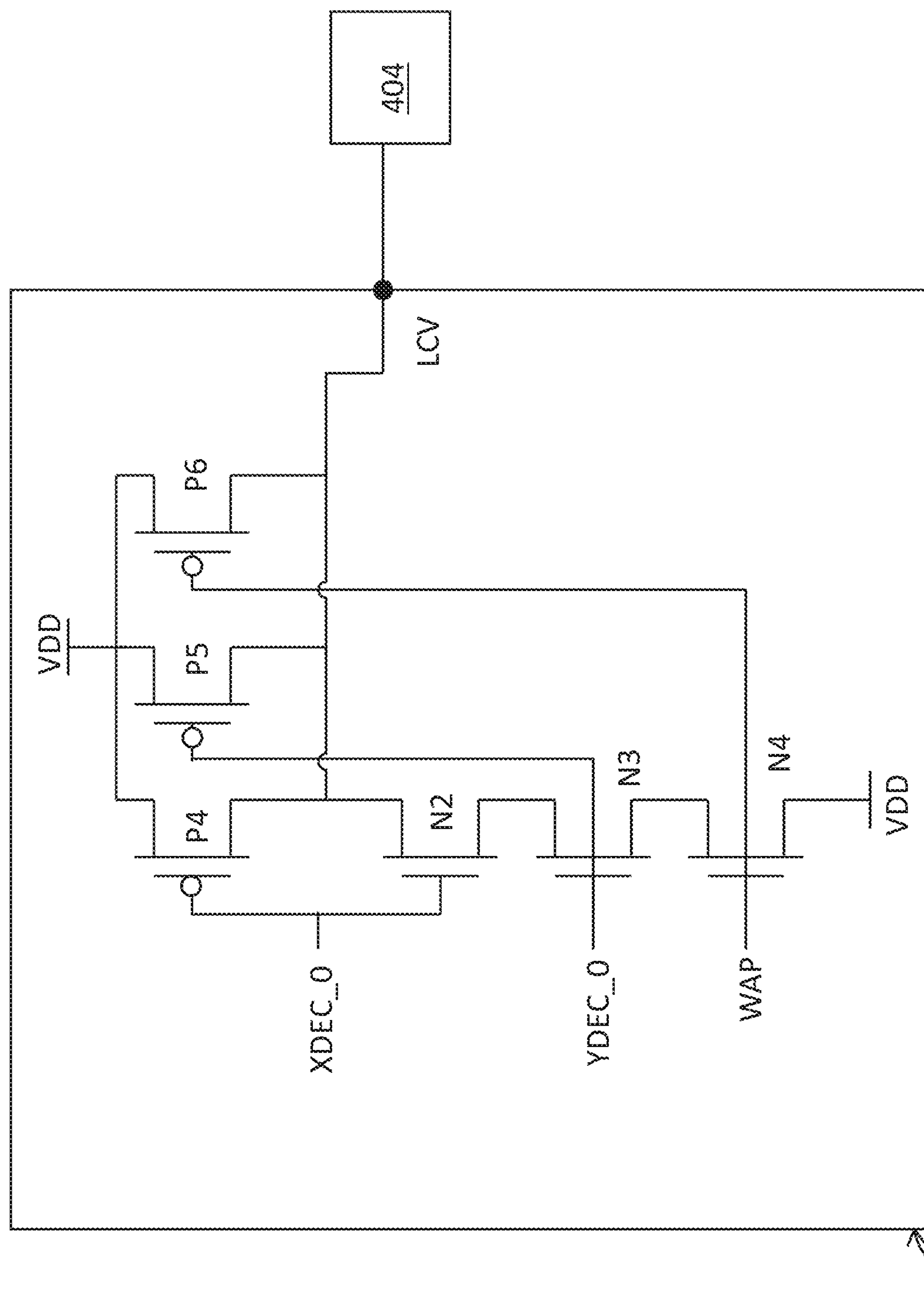
FIG. 5A is a schematic diagram of a write logic cell in accordance with one or more embodiments.

FIG. 5A is a schematic diagram of a write logic cell 502 in accordance with one or more embodiments. Write logic cell 502 is an embodiment of write logic cell 320 shown in FIG. 3 and memory cell 404 is an embodiment of memory cell 322 in FIG. 3. Write logic cell 502 is connected to memory cell 404. Write logic cell 502 is configured to receive an X-Decoder signal XDEC_0, a Y-Decoder signal YDEC_0, and an input control signal WAP. Write logic cell 502 is configured to send output signal LCV to memory cell 404. Write logic cell 502 includes a PMOS transistor P4, a PMOS transistor P5, a PMOS transistor P6, an NMOS transistor N2, an NMOS transistor N3 and an NMOS transistor N4.

The gate of PMOS transistor P4 is connected to the gate of NMOS transistor N2. The gate of PMOS transistor P5 is connected to the gate of NMOS transistor N3. The gate of PMOS transistor P6 is connected to the gate of NMOS transistor N4.

The gate of PMOS transistor P4 is configured to receive X-Decoder signal XDEC_0. The X-Decoder signal XDEC_0 is e.g., a low logical value or a high logical value. The X-Decoder signal XDEC_0 is an embodiment of the XDEC write row output 308 shown in FIG. 3. The source of PMOS transistor P4 is connected to a voltage source VDD and to the source of PMOS transistors P5 and P6. The drain of PMOS transistor P4 is connected to the drain of PMOS transistor P5, the drain of PMOS transistor P6, the drain of NMOS transistor N2, and memory cell 404. In some embodiments, PMOS transistor P4 functions as a switch triggered by the received X-Decoder signal XDEC_0. For example, if the received X-Decoder signal XDEC_0 is a low logical value, the PMOS transistor P4 is in an ON state. For example, if the received X-Decoder signal XDEC_0 is a high logical value, the PMOS transistor P4 is in an OFF state. In some embodiments, transistor P4 is an NMOS transistor or another equivalent circuit that functions as a switch device.

The gate of PMOS transistor P5 is configured to receive Y-Decoder signal YDEC_0. The Y-Decoder signal YDEC_0 is e.g., a low logical value or a high logical value. The Y-Decoder signal YDEC_0 is an embodiment of the YDEC write column output 312 shown in FIG. 3. The source of PMOS transistor P5 is connected to a voltage source VDD and to the source of PMOS transistors P4 and P6. The drain of PMOS transistor P5 is connected to the drain of PMOS transistor P4, the drain of PMOS transistor P6, the drain of NMOS transistor N2, and memory cell 404. In some embodiments, PMOS transistor P5 functions as a switch triggered by the received Y-Decoder signal YDEC_0. For example, if the received Y-Decoder signal YDEC_0 is a low logical value, the PMOS transistor P5 is in an ON state. For example, if the received Y-Decoder signal YDEC_0 is a high logical value, the PMOS transistor P5 is in an OFF state. In some embodiments, transistor P5 is an NMOS transistor or another equivalent circuit that functions as a switch device.

The gate of PMOS transistor P6 is configured to receive input control signal WAP. The input control signal WAP is e.g., a low logical value or a high logical value. The input control signal WAP is received from a WAP generator positioned on the same level as the write logic cell 502. In some embodiments, input control signal WAP controls the pulse width of output signal LCV. In some embodiments, each write logic cell 502 includes a corresponding input control signal WAP. The source of PMOS transistor P6 is connected to a voltage source VDD and to the source of PMOS transistors P4 and P5. The drain of PMOS transistor P6 is connected to the drain of PMOS transistor P4, the drain of PMOS transistor P5, the drain of NMOS transistor N2, and memory cell 404. In some embodiments, PMOS transistor P6 functions as a switch triggered by the received input control signal WAP. For example, if the received input control signal WAP is a low logical value, the PMOS transistor P6 is in an ON state. For example, if the received input control signal WAP is a high logical value, the PMOS transistor P6 is in an OFF state. In some embodiments, transistor P6 is an NMOS transistor or another equivalent circuit that functions as a switch device.

The gate of NMOS transistor N2 is configured to receive X-Decoder signal XDEC_0. The X-Decoder signal XDEC_0 is e.g., a low logical value or a high logical value. The X-Decoder signal XDEC_0 is an embodiment of the XDEC write row output 308 shown in FIG. 3. The source of NMOS transistor N2 is connected to the drain of NMOS transistor N3. The drain of NMOS transistor N2 is connected to the drain of PMOS transistor P4, the drain of PMOS transistor P5, the drain of PMOS transistor P6, and memory cell 404. In some embodiments, NMOS transistor N2 functions as a switch triggered by the received X-Decoder signal XDEC_0. For example, if the received X-Decoder signal XDEC_0 is a low logical value, the NMOS transistor N2 is in an OFF state. For example, if the received X-Decoder signal XDEC_0 is a high logical value, the NMOS transistor N2 is in an ON state. In some embodiments, transistor N2 is a PMOS transistor or another equivalent circuit that functions as a switch device.

The gate of NMOS transistor N3 is configured to receive Y-Decoder signal YDEC_0. The Y-Decoder signal YDEC_0 is e.g., a low logical value or a high logical value. The Y-Decoder signal YDEC_0 is an embodiment of the YDEC write column output 312 shown in FIG. 3. The source of NMOS transistor N3 is connected to the drain of NMOS transistor N4. The drain of NMOS transistor N3 is connected to the source of NMOS transistor N2. In some embodiments, NMOS transistor N3 functions as a switch triggered by the received Y-Decoder signal YDEC_0. For example, if the received Y-Decoder signal YDEC_0 is a low logical value, the NMOS transistor N3 is in an OFF state. For example, if the received Y-Decoder signal YDEC_0 is a high logical value, the NMOS transistor N3 is in an ON state. In some embodiments, transistor N3 is a PMOS transistor or another equivalent circuit that functions as a switch device.

The gate of NMOS transistor N4 is configured to receive input control signal WAP. The input control signal WAP is e.g., a low logical value or a high logical value. The source of NMOS transistor N4 is connected to a voltage source VDD. The drain of NMOS transistor N4 is connected to the source of NMOS transistor N3. In some embodiments, NMOS transistor N4 functions as a switch triggered by the received input control signal WAP. For example, if the received input control signal WAP is a low logical value, the NMOS transistor N4 is in an OFF state. For example, if the received input control signal WAP is a high logical value, the NMOS transistor N4 is in an ON state. In some embodiments, transistor N4 is a PMOS transistor or another equivalent circuit that functions as a switch device.

In some embodiments, if X-Decoder signal XDEC_0, Y-Decoder signal YDEC_0 and input control signal WAP are a low logical value, PMOS transistors P4, P5 and P6 are active and NMOS transistors N2, N3 and N4 are inactive. In this example, if PMOS transistors P4, P5 and P6 are active, output signal LCV is a high voltage value substantially equal to VDD (shown in FIG. 5B as curve 516).

In some embodiments, if X-Decoder signal XDEC_0, Y-Decoder signal YDEC_0 and input control signal WAP are a high logical value, PMOS transistors P4, P5 and P6 are inactive and NMOS transistors N2, N3 and N4 are active. In this example, if NMOS transistors N2, N3 and N4 are active, output signal LCV transitions to a voltage value (shown in FIG. 5B as curve 516) reduced by ΔV. For example, ΔV is represented by Formula 1:

$$\Delta V = VDD - V_{threshold\ N} \tag{1}$$

Where ΔV is the voltage change of curve 516, VDD is the voltage of voltage source VDD, and $V_{threshold\ N}$ is the threshold voltage of NMOS transistor N4.

In some embodiments, if input control signal WAP transitions to a low logical value, PMOS transistor P6 is active. In this example, if NMOS transistors N2 and N3 are active and PMOS transistor P6 is active, output signal LCV transitions to a high voltage value.

Figure 5B:
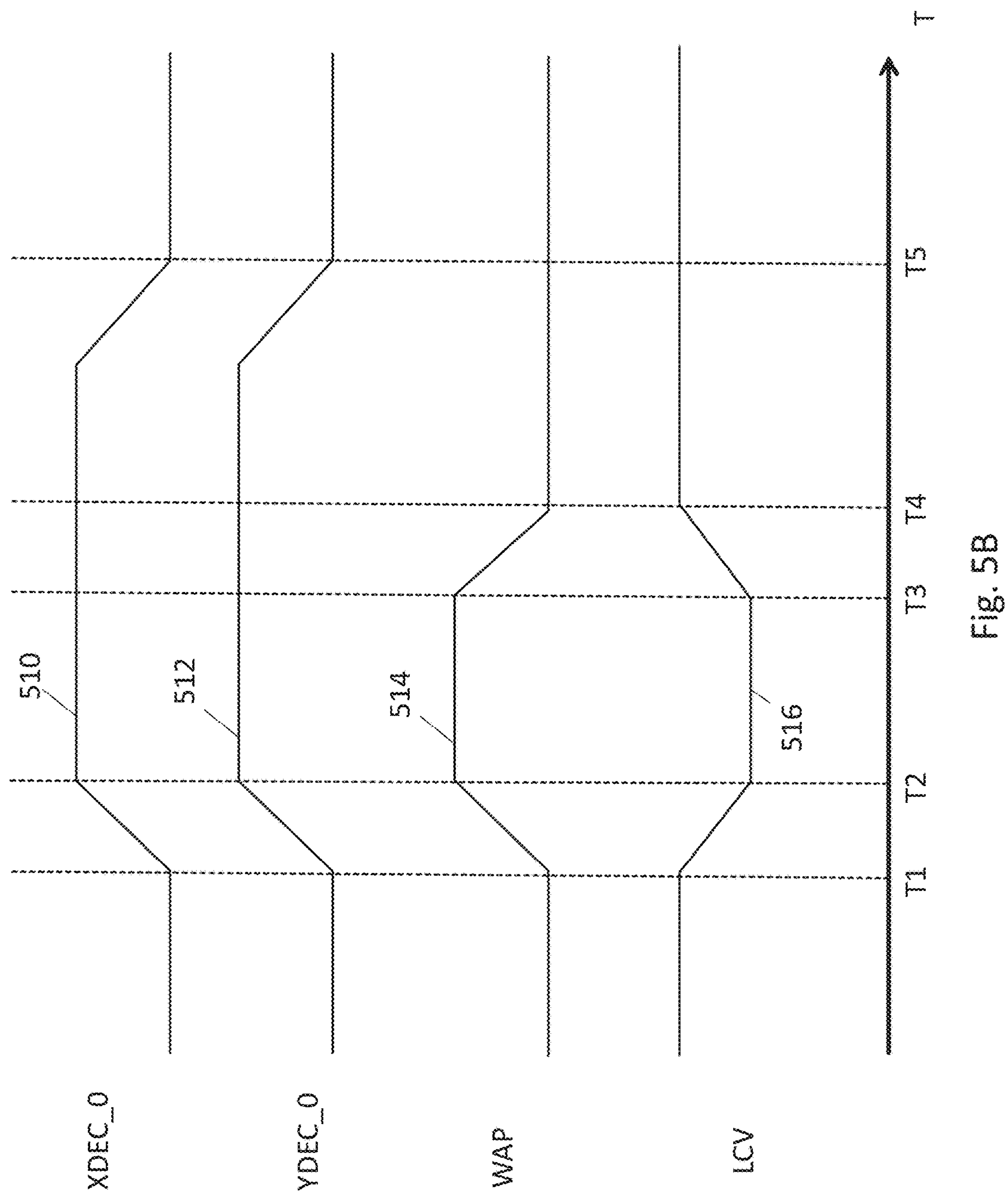
FIG. 5B is a graph of waveforms used to illustrate an operation of the circuit in FIG. 5A, in accordance with one or more embodiments.

FIG. 5B is a chart of timing signals for accessing memory cells in accordance with an embodiment of write logic cell 502. The timing chart depicts curves of X-Decoder signal XDEC_0, Y-Decoder signal YDEC_0, input control signal WAP and output signal LCV.

As depicted in FIG. 5B, X-Decoder signal XDEC_0 starts transitioning from a low voltage signal to a high voltage signal at time T1, finishes transitioning from low to high at time T2 and returns to low at time T5, as represented by curve 510. Y-Decoder signal YDEC_0 starts transitioning from a low voltage signal to a high voltage signal at time T1, finishes transitioning from low to high at time T2 and returns to low at time T5, as represented by curve 512. Input control signal WAP starts transitioning from a low voltage signal to a high voltage signal at time T1, finishes transitioning from low to high at time T2, starts transitioning from a high voltage signal to a low voltage signal at time T3, and returns to low at time T4, as represented by curve 514. The write logic cell 502 receives the X-Decoder signal XDEC_0, Y-Decoder signal YDEC_0 and the input control signal WAP, and the output signal LCV, as represented by curve 516, is generated. As shown in FIG. 5B, the output signal LCV, as represented by curve 516, is reduced/discharged by a lower voltage level approximately equal to ΔV.

At time T1, the X-Decoder signal XDEC_0, Y-Decoder signal YDEC_0 and the input control signal WAP start transitioning from a low signal to a high signal. As the X-Decoder signal XDEC_0, Y-Decoder signal YDEC_0 and the input control signal WAP start transitioning from low to high at time T1, the output signal LCV, as represented by curve 516, starts to discharge toward a low voltage level (from a higher level approximately equal to voltage source VDD).

At time T2, the X-Decoder signal XDEC_0, Y-Decoder signal YDEC_0 and the input control signal WAP finish transitioning from a low signal to a high signal. As the X-Decoder signal XDEC_0, Y-Decoder signal YDEC_0 and the input control signal WAP finish transitioning from low to high at time T2, the output signal LCV, as represented by curve 516, stops discharging and is reduced by ΔV, and reaches a relatively flat lower voltage level substantially equal to $V_{threshold}$.

At time T3, the X-Decoder signal XDEC_0 and the Y-Decoder signal YDEC_0 maintain a relatively flat high level, and the input control signal WAP starts transitioning from a high signal to a low signal. As the input control signal WAP starts transitioning from high to low after time T3, the output signal LCV, as represented by curve 516, starts transitioning from a lower voltage level substantially equal to $V_{threshold}$ to a high voltage level (approximately equal to VDD).

At time T4, the X-Decoder signal XDEC_0 and the Y-Decoder signal YDEC_0 maintain a relatively flat high level, and the input control signal WAP finishes transitioning from a high signal to a low signal. As the input control signal WAP finishes transitioning from high to low after time T4, the output signal LCV, as represented by curve 516, finishes transitioning from a lower voltage level to a high voltage level (approximately equal to VDD). After time T4, the X-Decoder signal XDEC_0 and the Y-Decoder signal YDEC_0 begin transitioning from a high to a low signal, input control signal WAP maintains a relatively flat low level and the output signal LCV, as represented by curve 516, maintains a relatively flat high level (approximately equal to VDD).

At time T5, the X-Decoder signal XDEC_0 and the Y-Decoder signal YDEC_0 finish transitioning from a high to a low signal. After time T5, X-Decoder signal XDEC_0, Y-Decoder signal YDEC_0 and input control signal WAP maintain a relatively flat low level, and the output signal LCV, as represented by curve 516, maintains a relatively flat high level (approximately equal to VDD).

Figure 6A:
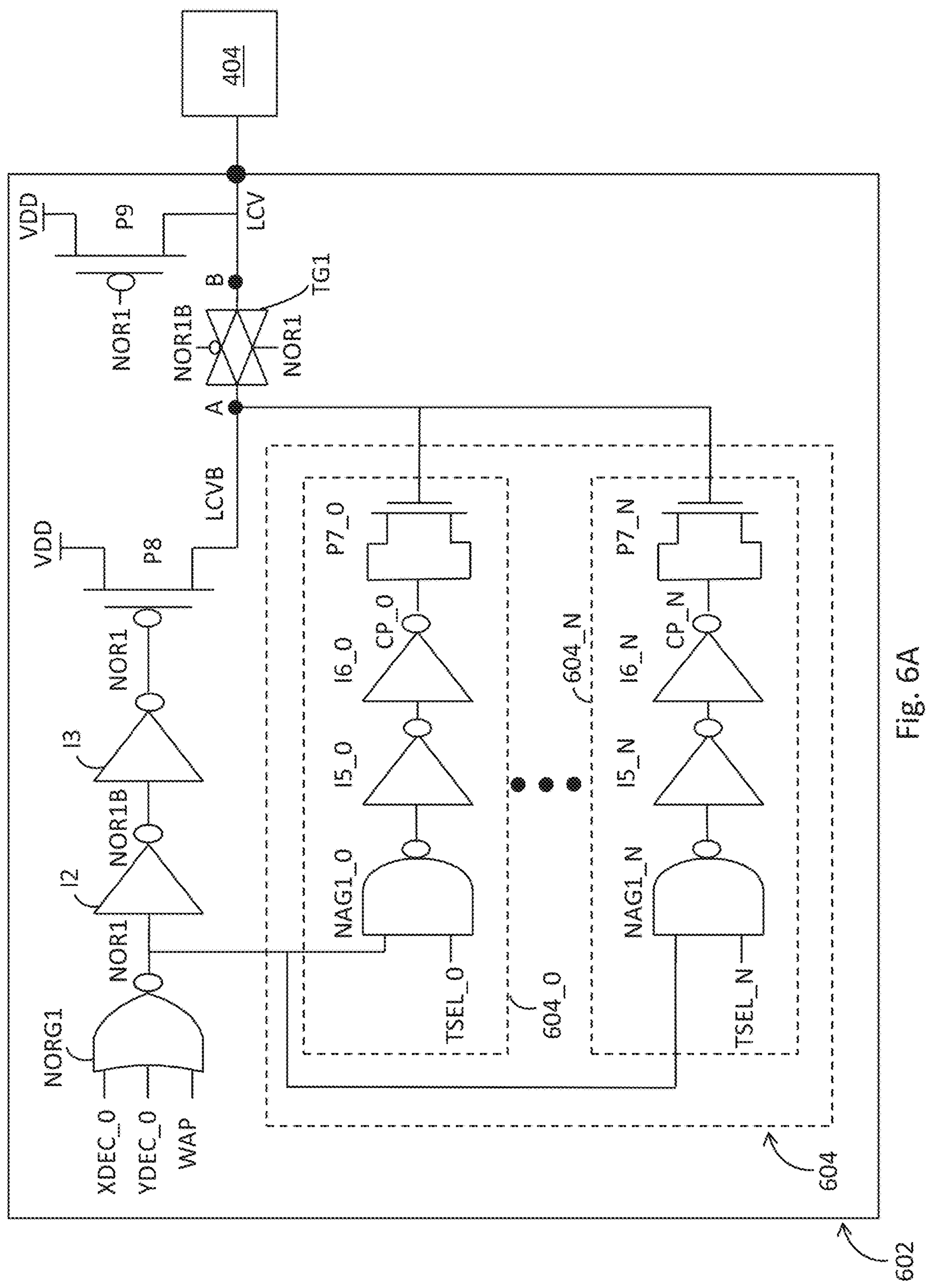
FIG. 6A is a schematic diagram of a write logic cell in accordance with one or more embodiments.

FIG. 6A is a schematic diagram of a write logic cell 602 in accordance with one or more embodiments. Write logic cell 602 is an embodiment of write logic cell 320 shown in FIG. 3 and memory cell 404 is an embodiment of memory cell 322 in FIG. 3. Write logic cell 602 is connected to memory cell 404. Write logic cell 602 is configured to receive an X-Decoder signal XDEC_0, a Y-Decoder signal YDEC_0, and an input control signal WAP. Write logic cell 602 is configured to send output signal LCV to memory cell 404. Write logic cell 602 includes a NOR gate NORG1, an inverter I2, an inverter I3, a PMOS transistor P8, a PMOS transistor P9, a transmission gate TG1 and programmable voltage tuner 604.

NOR gate NORG1 is configured to receive X-Decoder signal XDEC_0, Y-Decoder signal YDEC_0, and input control signal WAP. The X-Decoder signal XDEC_0 is e.g., a low logical value or a high logical value. The X-Decoder signal XDEC_0 is an embodiment of the XDEC write row output 308 shown in FIG. 3. The Y-Decoder signal YDEC_0 is e.g., a low logical value or a high logical value. The Y-Decoder signal YDEC_0 is an embodiment of the YDEC write column output 312 shown in FIG. 3. The input control signal WAP is e.g., a low logical value or a high logical value. In some embodiments, input control signal WAP is received from a WAP generator positioned on the same level as the write logic cell 602. In some embodiments, input control signal WAP controls the pulse width of output signal LCV. In some embodiments, each write logic cell 602 includes a corresponding input control signal WAP. NOR gate NORG1 is configured to send a signal NOR1. NOR gate NORG1 is connected to inverter I2 and programmable voltage tuner 604. NOR gate NORG1 includes three inputs; one input of NOR gate NORG1 is connected to the source of the X-Decoder signal XDEC_0, one input of NOR gate NORG1 is connected to the source of the Y-Decoder signal YDEC_0 and one input of NOR gate NORG1 is connected to the source of the input control signal WAP.

Inverter I2 is connected to NOR gate NORG1, inverter I3 and programmable voltage tuner 604. Inverter I2 is configured to receive the signal NOR1 from the NOR gate NORG1. Inverter I2 is configured to send an inverted signal NOR1B to inverter I3.

Inverter I3 is connected to inverter I2 and to the gate of PMOS transistor P8. Inverter I3 is configured to receive the inverted signal NOR1B from the inverter I2. Inverter I3 is configured to send signal NOR1 to PMOS transistor P8.

The gate of PMOS transistor P8 is connected to Inverter I3 and is configured to receive the signal NOR1. The source of PMOS transistor P8 is connected to voltage source VDD. The drain of PMOS transistor P8 is connected to transmission gate TG1 and the programmable voltage tuner 604 (by the gate of each PMOS transistor P7_0, . . . , P7_N).

Transmission gate TG1 is connected to PMOS transistor P8, programmable voltage tuner 604, PMOS transistor P9 and memory cell 404. The complementary nodes of transmission gate TG1 are configured to receive signal NOR1 and inverted signal NOR1B. Node A of transmission gate TG1 is connected to the drain of PMOS transistor P8 and programmable voltage tuner 604. Node B of transmission gate TG1 is connected to the drain of PMOS transistor P9 and memory cell 404. In some embodiments, transmission gate TG1 is a bi-directional device.

The gate of PMOS transistor P9 is configured to receive the signal NOR1. In some embodiments, the gate of PMOS transistor P9 is connected to the inverter I3. The source of PMOS transistor P9 is connected to voltage source VDD. The drain of PMOS transistor P9 is connected to transmission gate TG1 and the memory cell 404.

Programmable voltage tuner 604 includes programmable voltage tuner 604_0, . . . , 604_N (where N is an integer with a value ranging from 0 to 5). In some embodiments, each programmable voltage tuner 604_0, . . . , 604_N is connected in parallel with each other. Programmable voltage tuner 604 includes NAND Gates NAG1_0, . . . , NAG1_N, inverters I5_0, . . . , I5_N, inverters I6_0, . . . , I6_N and PMOS transistors P7_0, . . . , P7_N (where N is an integer with a value ranging from 0 to 5). In some embodiments, N is equal to 0 such that the programmable voltage tuner 604 includes a single stage (programmable voltage tuner 604_0); and programmable voltage tuner 604_0 includes NAND Gate NAG1_0, inverter I5_0, inverter I6_0 and PMOS transistor P7_0. In some embodiments, N is equal to 1 such that the programmable voltage tuner 604 includes two stages (programmable voltage tuner 604_0 and 604_1) connected to each other; programmable voltage tuner 604_0 includes NAND Gate NAG1_0, inverter I5_0, inverter I6_0 and PMOS transistor P7_0; and programmable voltage tuner 604_1 includes NAND Gate NAG1_1, inverter I5_1, inverter I6_1 and PMOS transistor P7_1. In some embodiments, PMOS transistors P7_0, . . . , P7_N function as a capacitor since the drain and source terminals of each PMOS transistor are coupled together.

Programmable voltage tuner 604 is configured to receive the signal NOR1 from the NOR gate NORG1 and select input signal TSEL_0, . . . , TSEL_N (where N is an integer with a value ranging from 0 to 5). Select input signal TSEL_0, . . . , TSEL_N is a low logical value or a high logical value signal. Programmable voltage tuner 604 is configured to send signal LCVB to transmission gate TG1. In some embodiments, N is equal to 0 such that programmable voltage tuner 604_0 is configured to receive select input signal TSEL_0. In some embodiments, N is equal to 1 such that programmable voltage tuner 604_0 is configured to receive select input signal TSEL_0 and programmable voltage tuner 604_1 is configured to receive select input signal TSEL_1.

Programmable voltage tuner 604_0 includes NAND Gate NAG1_0, inverter I5_0, inverter I6_0 and PMOS transistor P7_0.

NAND gate NAG1_0 is connected to NOR gate NORG1, inverter I2, inverter I5_0 and to each of the remaining NAND gates NAG_0, . . . , NAG1_N, in programmable voltage tuner 604_0, . . . , 604_N (where N is an integer with a value ranging from 0 to 5). NAND gate NAG1_0 is configured to receive the signal NOR1 from the NOR gate NORG1 and select input signal TSEL_0. NAND gate NAG1_0 is configured to send a signal to inverter I5_0.

Inverter I5_0 is connected to NAND gate NAG1_0 and inverter I6_0. Inverter I5_0 is configured to receive the signal from the NAND gate NAG1_0. Inverter I5_0 is configured to send an inverted signal to inverter I6_0.

Inverter I6_0 is connected to inverter I5_0 and PMOS transistor P7_0. Inverter I6_0 is configured to receive the inverted signal from inverter I5_0. Inverter I6_0 is configured to send a signal CP_0 to PMOS transistor P7_0.

The drain of PMOS transistor P7_0 is connected to the source of PMOS transistor P7_0. The gate of PMOS transistor P7_0 is connected to the drain of PMOS transistor P8 and to the gate of each of the remaining PMOS transistors P7_0, . . . , P7_N in programmable voltage tuner 604_0, . . . , 604_N (where N is an integer with a value ranging from 0 to 5).

Each of the connections for programmable voltage tuner 604_0 repeat for each subsequent stage of programmable voltage tuner 604_N, where N is an integer with a value ranging from 0 to 5.

Programmable voltage tuner 604_N includes NAND Gate NAG1_N, inverter I5_N, inverter I6_N and PMOS transistor P7_N.

NAND gate NAG1_N is connected to NOR gate NORG1, inverter I2, inverter I5_N and to each of the remaining NAND gates NAG1_0, . . . , NAG1_N in programmable voltage tuner 604_0, . . . , 604_N (where N is an integer with a value ranging from 0 to 5). NAND gate NAG1_N is configured to receive the signal NOR1 from the NOR gate NORG1 and select input signal TSEL_N. NAND gate NAG1_N is configured to send a signal to inverter I5_N.

Inverter I5_N is connected to NAND gate NAG1_N and inverter I6_N. Inverter I5_N is configured to receive the signal from the NAND gate NAG1_N. Inverter I5_N is configured to send an inverted signal to inverter I6_N.

Inverter I6_N is connected to inverter I5_N and PMOS transistor P7_N. Inverter I6_N is configured to receive the inverted signal from inverter I5_N. Inverter I6_N is configured to send a signal CP_N to PMOS transistor P7_N.

The drain of PMOS transistor P7_N is connected to the source of PMOS transistor P7_N. The gate of PMOS transistor P7_N is connected to the drain of PMOS transistor P8 and to the gate of each of the remaining PMOS transistors P7_0, . . . , P7_N in programmable voltage tuner 604_0, . . . , 604_N (where N is an integer with a value ranging from 0 to 5).

In some embodiments, transistors P7_0, . . . , P7_N are an NMOS transistor or another equivalent circuit. In some embodiments, the number of PMOS transistors P7_0, . . . , P7_N ranges from 1 PMOS transistor to 6 PMOS transistors, where each of the PMOS transistors P7_0, . . . , P7_N is contained in a corresponding programmable voltage tuner 604_0, . . . , 604_N (where N is an integer with a value ranging from 0 to 5). In some embodiments, each programmable voltage tuner 604_0, . . . , 604_N (where N is an integer with a value ranging from 0 to 5) is connected in parallel to each other. As the number of active programmable voltage tuner 604_0, . . . , 604_N is increased, the value of the output signal LCV (transitions from curve 616 to curve 618 in FIG. 6B) is reduced to a lower voltage level.

In some embodiments, integer N is equal to 0 and programmable voltage tuner 604 includes a single stage with NAND gate NAG1, inverter I5_0, inverter I6_0 and PMOS transistor P7_0; if any of X-Decoder signal XDEC_0, Y-Decoder signal YDEC_0 and input control signal WAP are a high logical value, then signal NOR1 is a low logical value. In this example, if signal NOR1 is a low logical value, inverted signal NOR1B is a high logical value, and PMOS transistor P8 and PMOS transistor P9 are active, transmission gate TG1 is inactive and PMOS transistor P7_0 functions as a capacitor since the drain and source terminals are coupled together. In this example, signal NOR1 is a low logical value, the output of NAND gate NAG1_0 is a high logical value, and inverter I5_0 inverts the high logical value to a low logical value, and inverter I6_0 inverts the low logical value to a high logical value such that signal CP_0 is a logical high and signal LCVB is a logical high (approximately VDD). In this example, signal NOR1 is a low logical value, PMOS transistor P8 and PMOS transistor P9 are active, and the transmission gate TG1 does not pass the signal between nodes A and B, and output signal LCV is a logical high (approximately VDD).

In some embodiments, integer N is equal to 0 and programmable voltage tuner 604 includes a single stage with NAND gate NAG1, inverter I5_0, inverter I6_0 and PMOS transistor P7_0; if each of X-Decoder signal XDEC_0, Y-Decoder signal YDEC_0 and input control signal WAP are a low logical value, then signal NOR1 is a high logical value. In this example, if signal NOR1 is a high logical value, inverted signal NOR1B is a low logical value, and PMOS transistor P8 and PMOS transistor P9 are inactive, transmission gate TG1 is active and PMOS transistor P7_0 functions as a capacitor since the drain and source terminals are coupled together. In this example, signal NOR1 is a high logical value and if received select signal TSEL_0 is a low logical value, the output of NAND gate NAG1_0 is a high logical value, and inverter I5_0 inverts the high logical value to a low logical value, and inverter I6_0 inverts the low logical value to a high logical value such that CP_0 is a logical high. In this example, if received select signal TSEL_0 is a high logical value and signal NOR1 is a high logical value, the output of NAND gate NAG1_0 is a low logical value, and inverter I5_0 inverts the low logical value to a high logical value, and inverter I6_0 inverts the high logical value to a low logical value, such that signal CP_0 is a logical low and signal LCVB is discharged towards a low voltage value (shown in FIG. 6B as curve 616). In this example, signal NOR1 is a high logical value, PMOS transistor P8 and PMOS transistor P9 are inactive and the transmission gate TG1 passes the signal between nodes A and B, such that output signal LCV and signal LCVB are substantially equal, and output signal LCV discharges toward a low voltage value (shown in FIG. 6B as curve 616). As the number of active devices in select programmable voltage tuner 604_0, . . . , 604_N are increased, the value of output signal LCV is decreased such that the curve of output signal LCV transitions from curve 616 to curve 618 (shown in FIG. 6B).

Figure 6B:
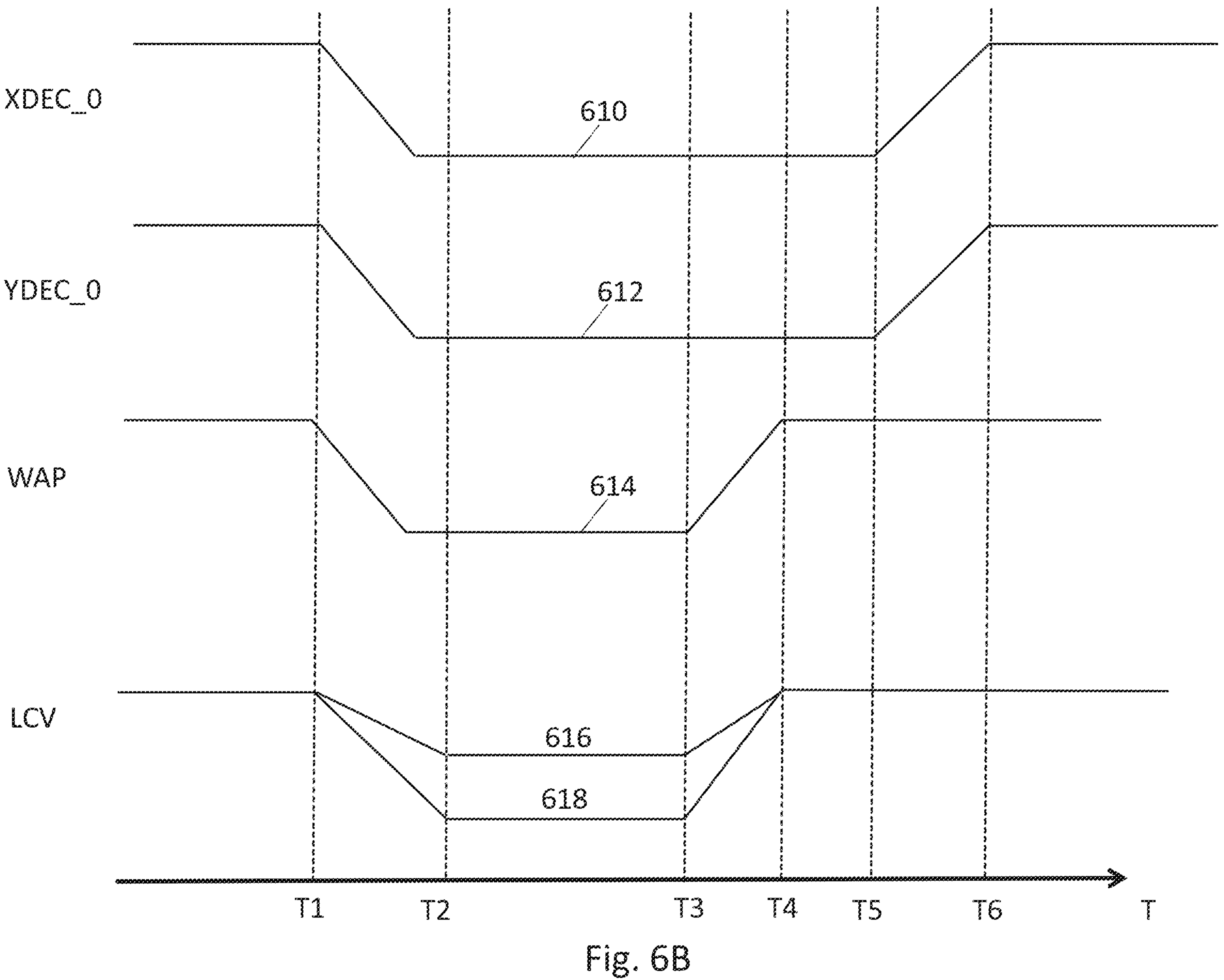
FIG. 6B is a graph of waveforms used to illustrate an operation of the circuit in FIG. 6A, in accordance with one or more embodiments.

FIG. 6B is a chart of timing signals for accessing memory cells in accordance with an embodiment of write logic cell 602. The timing chart depicts curves of X-Decoder signal XDEC_0, Y-Decoder signal YDEC_0, input control signal WAP and output signal LCV.

As depicted in FIG. 6B, X-Decoder signal XDEC_0 starts transitioning from a high voltage signal to a low voltage signal at time T1, finishes transitioning from high to low at time T2 and returns to high at time T6, as represented by curve 610. Y-Decoder signal YDEC_0 starts transitioning from a high voltage signal to a low voltage signal at time T1, finishes transitioning from high to low at time T2 and returns to high at time T6, as represented by curve 612. Input control signal WAP starts transitioning from a high voltage signal to a low voltage signal at time T1, finishes transitioning from high to low at time T2, starts transitioning from a low voltage signal to a high voltage signal at time T3, and returns to high at time T4, as represented by curve 614. The write logic cell 602 receives the X-Decoder signal XDEC_0, Y-Decoder signal YDEC_0 and the input control signal WAP, and the output signal LCV, as represented by curves 616 and 618, are generated. As shown in FIG. 6B, as the number of active programmable voltage tuners 604_0, . . . , 604_N is increased, the value of the output signal LCV, as represented by curve 616, is reduced/discharged to a lower, corresponding voltage level (as shown as curve 618).

At time T1, the X-Decoder signal XDEC_0, Y-Decoder signal YDEC_0 and the input control signal WAP start transitioning from a high signal to a low signal. As the X-Decoder signal XDEC_0, Y-Decoder signal YDEC_0 and the input control signal WAP start transitioning from high to low at time T1, the output signal LCV, as represented by curves 616 and 618, starts to discharge toward a low voltage level.

At time T2, the X-Decoder signal XDEC_0, Y-Decoder signal YDEC_0 and the input control signal WAP finish transitioning from a high signal to a low signal. As the X-Decoder signal XDEC_0, Y-Decoder signal YDEC_0 and the input control signal WAP finish transitioning from high to low at time T2, the output signal LCV, as represented by curves 616 and 618, finishes discharging and reaches a relatively flat lower signal level, and subsequently maintains the relatively flat lower signal level.

At time T3, the X-Decoder signal XDEC_0 and the Y-Decoder signal YDEC_0 maintain a relatively flat low signal level, and the input control signal WAP starts transitioning from a low signal to a high signal. As the input control signal WAP starts transitioning from low to high after time T3, the output signal LCV, as represented by curves 616 and 618, starts transitioning from a low signal to a high signal level.

At time T4, the X-Decoder signal XDEC_0 and the Y-Decoder signal YDEC_0 maintain a relatively flat low signal level, and the input control signal WAP and output signal LCV finish transitioning from a low signal to a high signal.

At time T5, the X-Decoder signal XDEC_0 and the Y-Decoder signal YDEC_0 start transitioning from a low signal level to a high signal level and input control signal WAP and output signal LCV maintain a relatively flat high signal level (approximately equal to VDD).

At time T6, the X-Decoder signal XDEC_0 and the Y-Decoder signal YDEC_0 finish transitioning from a low to a high signal, and the input control signal WAP and the output signal LCV, as represented by curves 616 and 618, maintains a relatively flat high signal level. After time T6, X-Decoder signal XDEC_0, Y-Decoder signal YDEC_0 and input control signal WAP and the output signal LCV, as represented by curves 616 and 618, maintain a relatively flat high level (approximately equal to VDD).

In at least some embodiments, one or more of the problems associated with SNM are mitigated and/or resolved by a 3D logic array that activates a write word line to one individual selected SRAM memory cell and prevents activation of write word lines to one or more unselected SRAM memory cells in the same row or column. By mitigating or resolving issues associated with SNM, memory device geometries are capable of being reduced.

One aspect of this description relates to an integrated circuit. The integrated circuit includes a memory cell array and an array of write assist circuits. The array of write assist circuits is electrically connected to the memory cell array. Each write assist circuit is configured to set an operating voltage of a corresponding memory cell. Each write assist circuit is configured to receive at least a first control signal, and generate an output signal at least in response to the first control signal. The output signal controlling the operating voltage of the corresponding memory cell. Each write assist circuit includes a programmable voltage tuner. The programmable voltage tuner includes a first P-type transistor and a second P-type transistor coupled to the first P-type transistor. A first terminal of the first P-type transistor is configured as a first input node to receive a first select control signal. A first terminal of the second P-type transistor is configured as a second input node to receive a second select control signal.

Another aspect of this description relates to an integrated circuit. The integrated circuit includes a memory cell array and an array of write assist circuits. The array of write assist circuits is electrically connected to the memory cell array. Each write assist circuit is configured to set an operating voltage of a corresponding memory cell. Each write assist circuit includes an array of programmable voltage tuners configured to receive at least a first control signal, and generate an output signal at least in response to the first control signal. The output signal controlling the operating voltage of each corresponding memory cell. The array of programmable voltage tuners includes a first capacitor coupled P-type transistor configured to send an output control signal to the corresponding memory cell in response to the first input signal and a first select control signal.

Still another aspect of this description relates to an integrated circuit. The integrated circuit includes an array of memory cells and an array of write logic cells. The integrated circuit also includes a write address row decoder comprising a plurality of write row outputs and a write address column decoder comprising a plurality of write column outputs. The array of write logic cells is electrically connected to the plurality of write row outputs and the plurality of the write column outputs. The array of write logic cells is electrically connected to the array of memory cells. The array of write logic cells is configured to set an operating voltage of the memory cells.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An integrated circuit, comprising:

a memory cell array;

an array of write assist circuits electrically coupled to the memory cell array, wherein:

each write assist circuit is configured to set an operating voltage of a corresponding memory cell; and each write assist circuit comprises a set of programmable voltage tuners configured to receive at least a first control signal, and generate an output signal at least in response to the first control signal, the output signal controlling the operating voltage of each corresponding memory cell, the set of programmable voltage tuners comprising:

a first programmable voltage tuner configured to receive the first control signal and a first select control signal, and to output the output signal, the first programmable voltage tuner comprising a first capacitor coupled P-type transistor configured to generate the output signal.

2. The integrated circuit of claim 1, wherein the set of programmable voltage tuners further comprising:

a second programmable voltage tuner coupled to the first programmable voltage tuner, and configured to receive the first control signal and a second select control signal, and to output the output signal, the second programmable voltage tuner comprising:

a second capacitor coupled P-type transistor configured to generate the output signal.

3. The integrated circuit of claim 1, wherein the first programmable voltage tuner further comprises:

a first inverter and a second inverter;

a first terminal of the first inverter is configured to receive a NAND output signal;

a second terminal of the first inverter is coupled to a first terminal of the second inverter; and a second terminal of the second inverter is coupled to a first terminal of the first capacitor coupled P-type transistor.

4. The integrated circuit of claim 3, wherein the first programmable voltage tuner further comprises:

a NAND gate, wherein:

a first terminal of the NAND gate is configured to receive the first select control signal;

a second terminal of the NAND gate is configured to receive the first control signal; and a third terminal of the NAND gate is coupled to the first terminal of the first inverter and is configured to generate the NAND output signal.

5. The integrated circuit of claim 1, wherein each write assist circuit further comprises:

a first P-type transistor, wherein a first terminal of the first P-type transistor is configured as a first input node to receive a first NOR output signal;

a second terminal of the first P-type transistor is coupled to a first node of the set of programmable voltage tuners; and a third terminal of the first P-type transistor is coupled to a supply voltage.

6. The integrated circuit of claim 5, wherein each write assist circuit further comprises:

a second P-type transistor, wherein a first terminal of the second P-type transistor is configured as a second input node to receive the first NOR output signal;

a second terminal of the second P-type transistor is coupled to a second node of the corresponding memory cell; and a third terminal of the second P-type transistor is coupled to the supply voltage.

7. The integrated circuit of claim 6, wherein each write assist circuit further comprises:

a transmission gate, wherein a first terminal of the transmission gate is configured to receive the first NOR output signal;

a second terminal of the transmission gate is configured to receive an inverted first NOR output signal;

a third terminal of the transmission gate is coupled to the first node of the set of programmable voltage tuners; and a fourth terminal of the transmission gate is coupled to the second node of the corresponding memory cell.

8. The integrated circuit of claim 7, wherein each write assist circuit further comprises:

a first inverter, and a second inverter, wherein a first terminal of the first inverter is configured to receive the inverted first NOR output signal;

a second terminal of the first inverter is coupled to the first terminal of the first P-type transistor, and is configured to generate the first NOR output signal;

a first terminal of the second inverter is configured to receive the first control signal; and a second terminal of the second inverter is coupled to the first terminal of the first inverter, and is configured to generate the inverted first NOR output signal.

9. The integrated circuit of claim 8, wherein each write assist circuit further comprises:

a NOR gate, wherein a first terminal of the NOR gate is configured to receive a first decoder signal;

a second terminal of the NOR gate is configured to receive a second decoder signal;

a third terminal of the NOR gate is configured to receive a second control signal; and a fourth terminal of the NOR gate is coupled to the first terminal of the second inverter, and is configured to generate the first control signal.

10. An integrated circuit, comprising:

a memory cell array; and an array of write assist circuits electrically coupled to the memory cell array, each write assist circuit being configured to set an operating voltage of a corresponding memory cell, and each write assist circuit comprising:

a NOR gate configured to generate a first NOR output signal; and a first programmable voltage tuner coupled to the NOR gate, and configured to set a first output signal in response to the first NOR output signal and a first select control signal, the first output signal controlling the operating voltage of the corresponding memory cell, the first programmable voltage tuner comprising a first capacitor coupled P-type transistor configured to output the first output signal.

11. The integrated circuit of claim 10, wherein the NOR gate comprises:

a first input terminal of the NOR gate configured to receive a first input signal;

a second input terminal of the NOR gate configured to receive a second input signal;

a third input terminal of the NOR gate configured to receive a third input signal; and a first output terminal of the NOR gate configured to generate the first NOR output signal in response to the first input signal, the second input signal and the third input signal.

12. The integrated circuit of claim 11, wherein each write assist circuit further comprises:

a first inverter coupled to the NOR gate; and a second inverter coupled to the first inverter, wherein a first terminal of the first inverter is coupled to the first output terminal of the NOR gate, and is configured to receive the first NOR output signal;

a second terminal of the first inverter is coupled to a first terminal of the second inverter, and is configured to generate a first signal inverted from the first NOR output signal;

the first terminal of the second inverter is configured to receive the first signal; and a second terminal of the second inverter is configured to generate a second signal inverted from the first signal.

13. The integrated circuit of claim 12, wherein each write assist circuit further comprises:

a first P-type transistor, wherein a gate terminal of the first P-type transistor is configured to receive the second signal;

a drain terminal of the first P-type transistor is coupled to a first node; and a source terminal of the first P-type transistor is coupled to a voltage supply.

14. The integrated circuit of claim 13, wherein each write assist circuit further comprises:

a second P-type transistor configured to set the operating voltage of the corresponding memory cell by a second output signal, wherein a gate terminal of the second P-type transistor is configured to receive the second signal;

a drain terminal of the second P-type transistor is coupled to a second node of the corresponding memory cell, the second node having a signal corresponding to the second output signal; and a source terminal of the second P-type transistor is coupled to the voltage supply.

15. The integrated circuit of claim 14, wherein each write assist circuit further comprises:

a transmission gate, wherein a first terminal of the transmission gate is configured to receive the second signal;

a second terminal of the transmission gate is configured to receive an inverted second signal;

a third terminal of the transmission gate is coupled to the first node; and a fourth terminal of the transmission gate is coupled to the second node.

16. The integrated circuit of claim 10, wherein the memory cell array is on a first level of the integrated circuit, and the array of write assist circuits is on a second level of the integrated circuit different from the first level of the integrated circuit.

17. An integrated circuit, comprising:

a memory cell array; and an array of write assist circuits electrically coupled to the memory cell array, each write assist circuit being configured to set an operating voltage of a corresponding memory cell by a first output signal, and each write assist circuit comprising:

a transmission gate coupled between a first node and a second node; and a first programmable voltage tuner coupled to the transmission gate, and configured to set a second output signal in response to a first NOR output signal and a first select control signal, the first programmable voltage tuner comprising a first capacitor coupled P-type transistor configured to generate the second output signal.

18. The integrated circuit of claim 17, wherein the transmission gate comprises:

a first terminal of the transmission gate configured to receive the first NOR output signal;

a second terminal of the transmission gate configured to receive an inverted first NOR output signal;

a third terminal of the transmission gate coupled to the first node and the first capacitor coupled P-type transistor, and configured to receive the second output signal; and a fourth terminal of the transmission gate coupled to the second node and the corresponding memory cell.

19. The integrated circuit of claim 18, wherein each write assist circuit further comprises:

a first inverter; and a second inverter coupled to the first inverter, wherein a first terminal of the first inverter is configured to receive the first NOR output signal;

a second terminal of the first inverter is coupled to a first terminal of the second inverter, and is configured to generate a first signal inverted from the first NOR output signal;

the first terminal of the second inverter is configured to receive the first signal; and a second terminal of the second inverter is configured to generate a second signal inverted from the first signal.

20. The integrated circuit of claim 19, wherein each write assist circuit further comprises:

a first P-type transistor coupled to at least the first node; and a second P-type transistor coupled to at least the second node, wherein a first terminal of the first P-type transistor is coupled to the second terminal of the second inverter, and is configured to receive the second signal;

a second terminal of the first P-type transistor is coupled to the first node and the third terminal of the transmission gate;

a third terminal of the first P-type transistor is coupled to a voltage supply;

a first terminal of the second P-type transistor is configured to receive the second signal;

a second terminal of the second P-type transistor is coupled to the second node and the fourth terminal of the transmission gate; and a third terminal of the second P-type transistor is coupled to the voltage supply.

* * * * *